US006744104B1

(12) United States Patent
Aoki et al.

(10) Patent No.: US 6,744,104 B1
(45) Date of Patent: Jun. 1, 2004

(54) SEMICONDUCTOR INTEGRATED CIRCUIT INCLUDING INSULATED GATE FIELD EFFECT TRANSISTOR AND METHOD OF MANUFACTURING THE SAME

(75) Inventors: Nobutoshi Aoki, Kanagawa-ken (JP);
Ichiro Mizushima, Kanagawa-ken (JP);
Kazuya Ohuchi, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/440,928

(22) Filed: Nov. 16, 1999

(30) Foreign Application Priority Data

Nov. 17, 1998 (JP) .......................... P10-326973

(51) Int. Cl.[7] .................. H01L 23/62; H01L 29/76; H01L 29/00; H01L 21/338
(52) U.S. Cl. .................. 257/372; 257/377; 257/412; 257/510; 438/172; 438/178
(58) Field of Search ................ 257/290–294, 257/412, 369, 371, 372, 377, 506, 510; 438/172, 178, 197

(56) References Cited

U.S. PATENT DOCUMENTS

| | | | | |
|---|---|---|---|---|
| 4,394,749 A | * | 7/1983 | Tsukada et al. | 365/106 |
| 4,839,702 A | * | 6/1989 | Grinberg et al. | 357/16 |
| 5,019,882 A | * | 5/1991 | Solomon et al. | 357/23.8 |
| 5,241,214 A | * | 8/1993 | Herbots et al. | 357/4 |
| 5,250,452 A | * | 10/1993 | Ozturk et al. | 437/41 |
| 5,354,700 A | * | 10/1994 | Huang et al. | 437/40 |
| 5,356,821 A | | 10/1994 | Naruse et al. | 437/34 |
| 5,357,119 A | * | 10/1994 | Wang et al. | 257/18 |
| 5,461,250 A | * | 10/1995 | Burghartz et al. | 257/347 |
| 5,583,059 A | * | 12/1996 | Burghartz | 437/31 |
| 5,665,981 A | * | 9/1997 | Banerjee et al. | 257/66 |
| 5,952,701 A | * | 9/1999 | Bulucea et al. | 257/407 |
| 6,008,525 A | * | 12/1999 | Barron et al. | 257/629 |
| 6,255,149 B1 | * | 7/2001 | Bensahel et al. | 438/172 |

FOREIGN PATENT DOCUMENTS

| | | |
|---|---|---|
| JP | 4-25176 | 1/1992 |
| JP | 05-183160 | 7/1993 |
| JP | 05-235335 | 10/1993 |
| JP | 06-077246 | 3/1994 |
| JP | 10-027854 | 1/1998 |
| JP | 10-163130 | 6/1998 |
| JP | 2876866 | 1/1999 |
| JP | 11-003999 | 1/1999 |
| JP | 11-87708 | * 3/1999 |

OTHER PUBLICATIONS

R.S. Muller and T.I. Kamins, Device Electronics for Integrated circuits, (second edn.), pp. 379 (1977).*
Tsu–Jae King et al., *IEEE Electron Device Letters* vol 12, No. 10, A Variable–Work–Function Polycrystalline–$Si_{1-x}Ge_x$ Gate Material for Submicrometer CMOS Technologies, pp. 533–535, (Oct. 10, 1991).

* cited by examiner

*Primary Examiner*—Long Pham
*Assistant Examiner*—Shrinivas H. Rao
(74) *Attorney, Agent, or Firm*—Foley & Lardner

(57) ABSTRACT

A gate electrode of an n-channel IGFET includes a first region composed of at least a first IV group element and a second IV group element which are different from each other, and a second region composed of the first IV group element. Similarly, a gate electrode of a p-channel IGFET includes first and second regions. For example, the first region is made of SiGe while the second region is made of Si. In both of the n-channel and P-channel IGFET, silicide electrodes are formed on the gate electrodes 4N and 4P through silicidation of at least parts of the second regions.

28 Claims, 23 Drawing Sheets

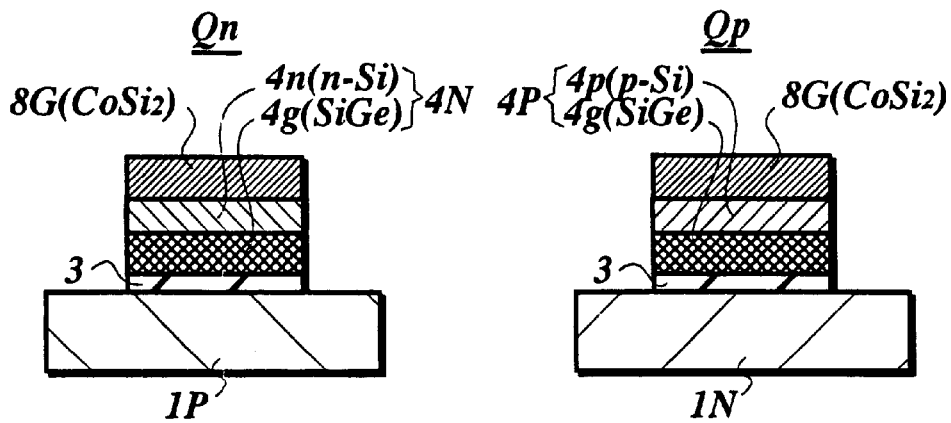
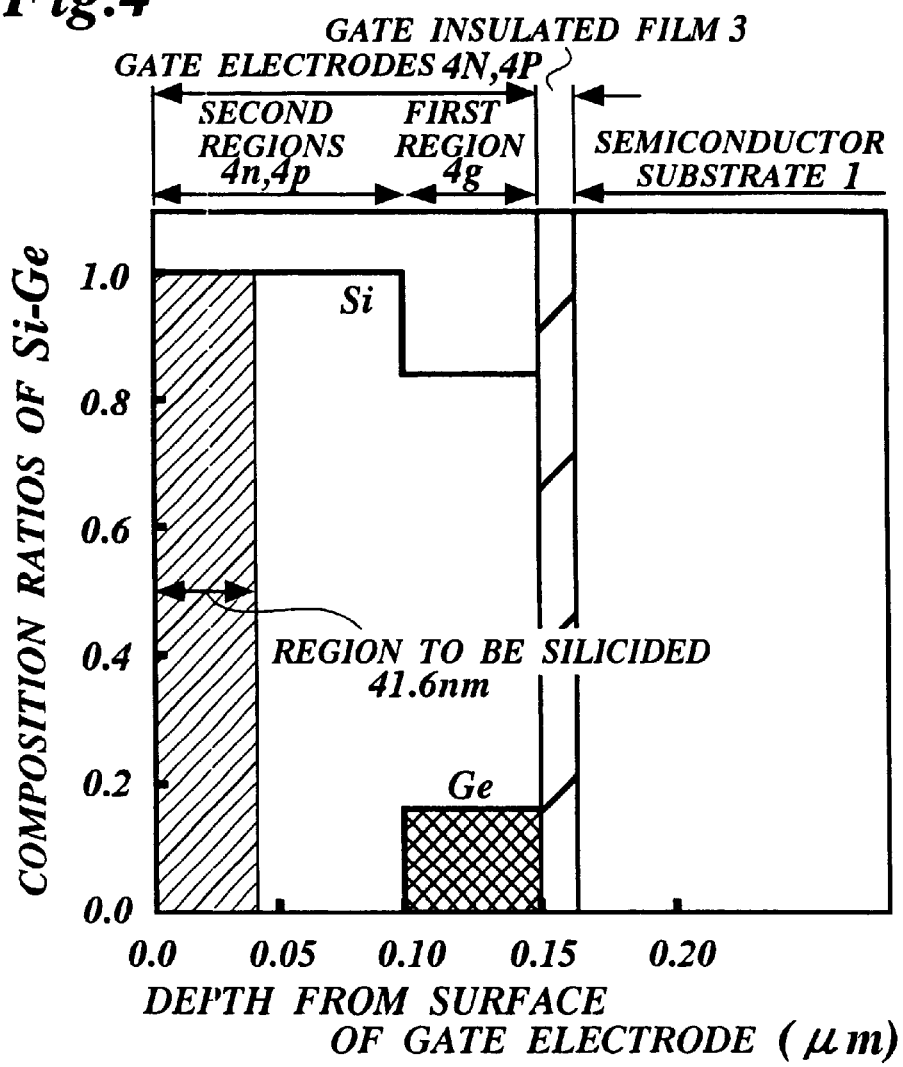

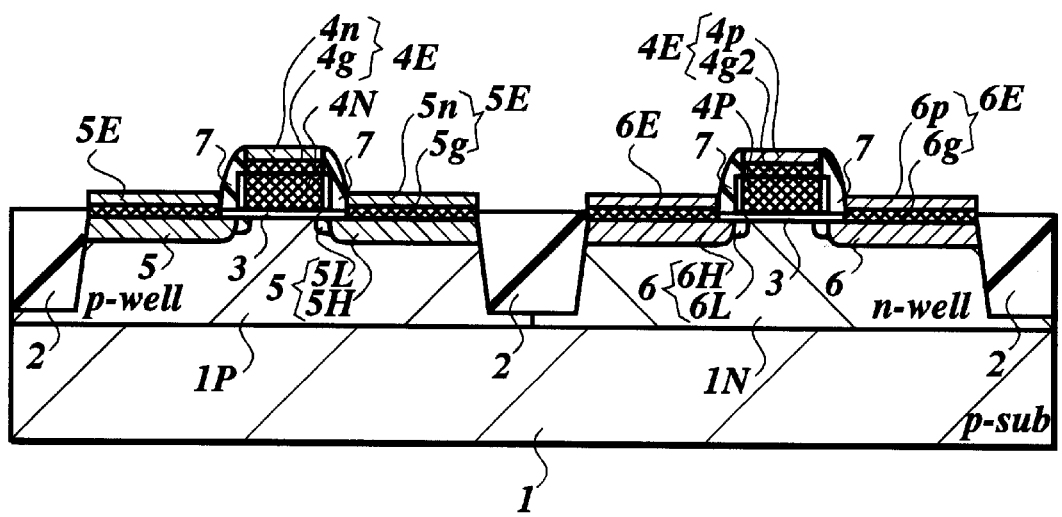

SEMICONDUCTOR INTEGRATED CIRCUIT INCLUDING INSULATED GATE FIELD EFFECT TRANSISTOR AND METHOD OF MANUFACTURING THE SAME

BACKGROUND OF THE INVENTION

1. Field of the Invention

This invention relates to a semiconductor integrated circuit including an insulated gate field effect transistor (hereinafter called "IGFET"), and a method of manufacturing the same, and more particularly to a semiconductor integrated circuit including an IGFET which is constituted by a gate electrode having regions composed of two or more IV group elements which are different from each other, and a method of manufacturing the same. More specifically, the invention relates to a semiconductor integrated circuit including an elevated or raised source drain electrode in a main electrode which is used as a source or drain electrode of an IGFET, and a method of manufacturing the same.

2. Description of the Related Art

As a MOSFET (Metal Oxide Semiconductor Field Effect Transistor) for constituting a semiconductor integrated circuit is being minimized, a gate insulated film of the MOFET tends to be made much thinner. Further, in order to suppress short channel effect due to minimization, a complementary MOSFET tends to adopt a dual gate structure for an electrode. In the dual gate electrode structure, a gate electrode of an n-channel MOSFET is set to an n-type while a gate electrode of a p-channel MOSFET is set to a p-type.

The electrode having the dual gate structure is generally manufactured by a process for manufacturing ordinary complementary MOSFET (CMOS) without an increase in the number of manufacturing processes. Specifically, in an n-channel MOSFET, an n-type impurity is doped in order to make source and drain electrodes for an n-type semiconductor region. Simultaneously, the n-type impurity is doped into a gate electrode. With a p-channel MOSFET, a p-type impurity is doped so as to make source and drain electrodes for a p-type semiconductor region. Concurrent with this, the same p-type impurity is doped into a gate electrode. Ion implantation is performed for the doping process. The doped gate electrode is annealed in order that the doped impurity is diffused and activated. The gate electrode doped by the n-type impurity is set to the n-type while the gate electrode doped by the p-type impurity is set to the p-type.

As the MOSFET is being minimized, the source and drain electrodes thereof are required to be made shallow and to have low resistivity. An elevated electrode structure is most preferable in order to meet the foregoing requirements. In the elevated electrode structure, elevated electrodes are laid over a source electrode (a semiconductor region) and a drain electrode (a semiconductor region) on a surface of a substrate made of single crystal Si (silicon). Each elevated electrode is formed by an epitaxial growth layer grown on the single crystal Si substrate. The source and drain electrodes are formed by diffusing an impurity over the single crystal Si substrate using the elevated electrodes as solid diffusion sources.

In the foregoing structure, the source and drain electrodes are formed through diffusion from the surface of the single crystal Si substrate, so that a shallow junction can be obtained. Further, one elevated electrode is laid over the source electrode, and the other elevated electrode is laid over the drain electrode. Therefore, it is possible to reduce resistivity of the electrodes.

However, the following considerations have not been taken in the semiconductor integrated circuit including the foregoing MOSFET.

(1) Use of the dual gate electrode structure causes different problems in the n-channel MOSFET and p-channel MOSFET, respectively. In the p-channel MOSFET, when forming source electrode and drain electrode having shallow junctions, ion implantation is executed using $BF_2$ (boron fluoride) ions which can accomplish shallow ion implantation distribution (profile) In such a case, F (fluoride) which is ion-implanted simultaneously with B (boron) infiltrates into a gate insulated film (gate oxide film), and promotes diffusion of B in the gate insulated film, so that B leaks through the substrate (channel forming region) from the gate electrode. Thinning of the gate insulated film due to the minimization enhances leakage of B. Even if there is no F, leakage of B occurs because of the thin insulated gate film. As a result, a threshold voltage of the p-channel MOSFET becomes variable, which unfortunately reduces electrical reliability of a semiconductor circuit.

Conversely, in the n-channel MOSFET, when forming source and drain electrodes having shallow junctions, As (arsenic) ions which diffuse slowly are used. In order to prevent an increase in the number of manufacturing processes, the source and drain electrodes are doped by As ions as an n-type impurity, similarly to the gate electrode. The As ions are suitable to form source and drain electrodes having shallow junctions (i.e. in order to make the source and drain electrodes shallow). However, a low diffusion speed of As makes it difficult for As to diffuse all over the gate electrode with a high concentration, which means that the gate insulated film of the gate electrode suffers from an insufficient As concentration. Especially, shallow source and drain electrodes tend to be annealed at a low temperature, which further promotes the insufficient As concentration on the gate insulated film of the gate electrode. Therefore, when gate bias is applied to the gate electrode during actual operation, a depletion layer is produced in the gate electrode, and a threshold voltage of the n-channel MOSFET is made variable. This inevitably lowers electrical reliability of the semiconductor integrated circuit.

(2) The lowered electrical reliability of the semiconductor integrated circuit is an obstacle for minimization of the MOSFET, and prevents further integration of the semiconductor integrated circuit.

(3) Japanese Patent Laid-Open Publication No. Hei 4-25176 discloses a technique to prevent leakage of B in a p-channel MOSFET. According to the publication, the gate electrode is composed of poly-crystal Si containing impurities such as Ge (germanium), and is doped by implanting B, which is effective in suppressing growth of grains of the poly-crystal Si in a heating process, and preventing B from diffusing along the grains. However, an existing gate electrode is usually provided with a silicide electrode which is formed thereon through silicidation, in order to accomplish low resistivity. The silicide electrode containing impurities such as Ge of the gate electrode suffers from a high resisisity. Therefore, it is very difficult to accelerate a switching operation of the MOSFET and reduce a power supply voltage.

(4) In the elevated electrode, B is used as the p-type impurity in order to form the source and drain electrodes of the p-channel MOSFET. B diffuses faster than As as the n-type impurity. Therefore, sufficient shallowing cannot be accomplished in the p-channel MOSFET, which prevents high integration of the semiconductor integrated circuit.

(5) Further, since B in the elevated electrode cannot have sufficiently high active concentration, the elevated electrode suffers from high resistivity. Therefore, it is very difficult to accelerate the switching operation of the p-channel MOSFET and reduce a power supply voltage.

(6) Research and development have in progress in order to form a silicide electrode in the elevated electrode and accomplish low resistivity in the elevated electrode. However, since it is impossible to minimize a contact resistance between the elevated electrode and the silicide electrode, it has been impossible to accelerate the switching operation of the MOSFET and reduce a power supply voltage.

SUMMARY OF THE INVENTION

This invention has been contemplated in order to overcome the foregoing problems of the related art. A first object of the invention is to provide a semiconductor integrated circuit including an insulated gate field effect transistor (IGFET) in which a gate electrode of the IGFET is protected against leakage of a doped impurity to a channel region in order to accomplish a reliable threshold voltage and improve electrical reliability.

It is a second object of the invention to maintain a sufficient concentration of the doped impurity all over the gate electrode and prevent formation of a depletion layer in the gate electrode, thereby accomplishing a reliable threshold voltage, and providing a semiconductor integrated circuit including the IGFET with improved electrical reliability.

A third object of the invention is to provide a semiconductor integrated circuit which accomplish the first and second objects simultaneously. Especially, the third object is intended to assure a reliable threshold voltage and to improve electrical reliability in a complementary IGFET having a p-channel type IGFET and an n-channel type IGFET.

A fourth object of the invention is to provide a semiconductor integrated circuit which includes a minimized IGFET and is highly integrated, while accomplishing any of the foregoing first to third objects.

According to a fifth object of the invention, a semiconductor integrated circuit is provided with an IGFET which has an accelerated switching speed and a reduced power supply voltage, and assures an accelerated circuit operation and a reduced power consumption, while accomplishing any of the first to third objects. Especially, it is possible to accelerate the switching operation of the IGFET and reduce the power supply voltage through reduction of a resistance of a silicide electrode formed on a gate electrode of the IGFET. Therefore, the semiconductor integrated circuit can accelerate its circuit operation and reduce a power consumption.

It is a sixth object of the invention to provide a method of manufacturing a semiconductor integrated circuit which can reduce the number of manufacturing steps, while accomplishing any of the first to fifth objects. Especially, the sixth object is intended to provide the method for manufacturing the semiconductor integrated circuit in which a complementary IGFET can be manufactured with a reduced number of steps.

A seventh object of the invention is to provide a semiconductor integrated circuit in which an IGFET includes an elevated electrode, and a shallow source electrode and a shallow drain electrode (i.e. main electrodes). Therefore, the semiconductor integrated circuit can be highly integrated through minimization of the IGFET.

It is an eighth object of the invention to provide a semiconductor integrated circuit which accomplishes the seventh object and in which an elevated electrode has low resistivity and a reduced power supply voltage. Therefore, the semiconductor integrated circuit can assure an accelerated circuit operation and a reduced power consumption.

A ninth object of the invention is to provide a semiconductor integrated circuit which accomplishes the seventh or eighth object and in which an elevated electrode and a silicide electrode have a low contact resistance. The semiconductor integrated circuit can assure an accelerated circuit operation and a reduced power consumption.

It is a tenth object of the invention to provide a method of manufacturing a semiconductor circuit which accomplishes the seventh to ninth objects and to reduce the number of manufacturing steps.

A final object of the invention is to provide a semiconductor integrated circuit which accomplish at least two or more of the first to tenth objects of the invention and a method of manufacturing such a semiconductor integrated circuit.

According to a first feature of the invention, there is provided a semiconductor integrated circuit including an IGFET of which gate electrode comprising: (a) a first region composed of at least a first IV group element and a second IV group element which are different from each other, and formed on a gate insulated film of a semiconductor substrate; and (b) a second region composed of the first IV group element and formed on the first region.

It is preferable that the first region of the gate electrode has a composition ratio of the second IV group element gradually or stepwise reduced in accordance with a distance from the gate insulated film.

The first IV group element for the gate electrode is Si (silicon), and the second IV group element is Ge (germanium) or C (carbon). The first region of the gate electrode preferable has a thickness which is larger than a width of a depletion layer produced in an Si electrode. A composition ratio of Ge in the first region is actually determined to be at least 0.1 or less. Either an Si layer which is 1 nm thick and is substantially free from the first IV group element Ge or a Ge layer which is 1 nm thick or less and is substantially free from Si may be present between the gate insulated film and the first region of the gate electrode.

The gate electrode of the p-channel IGFET preferably contains at least B. The gate electrode of the n-channel IGFET preferably contains at least As.

In the foregoing semiconductor integrated circuit, the gate insulated film of the gate electrode of the p-channel IGFET contains Ge or C which is the second IV group element, so that a diffusion speed of the B as the p-type impurity is reduced, and leakage of B into the channel region can be prevented. As a result, it is possible to stabilize a threshold voltage of the p-channel IGFET, and to improve electrical reliability of the semiconductor integrated circuit. Further, in the case of the n-channel IGFET, the gate insulated film of the gate electrode contains Ge or C in the second IV group element, which increases a diffusion speed of As as the n-type impurity, and maintains sufficient impurity distribution of As all over the gate electrode. Therefore, it is possible to prevent the gate electrode from being changed into a depletion layer, to stabilize a threshold voltage of the n-channel IGFET, and improve electrical reliability of the semiconductor integrated circuit. Especially, with the semiconductor integrated circuit including a complementary IGFET of the dual gate structure, use of the gate electrode composed of the first and second IV group elements can stabilize threshold voltages of both the p-channel and n-channel IGFETs at the same time. As a result, it is possible to minimize the IGFETs and promote integration of the semiconductor integrated circuit.

According to a second feature of the invention, the semiconductor integrated circuit having the first feature includes a silicide electrode which is formed in contact with the second region of the gate electrode of the IGFET and is substantially free from the second IV group element, i.g. Ge or C. The silicide electrode is actually constituted by a $CoSi_y$ or $TiSi_y$ film.

The silicide electrode substantially free from the second IV group element can have low resistivity, which is effective in accelerating the switching operation of the IGFET and reducing a power supply voltage. Therefore, the semiconductor integrated circuit can operate very quickly and reduce a power consumption.

In accordance with a third feature, a semiconductor integrated circuit comprises: an IGFET including a gate electrode which is provided with a first region composed of at least a first IV group element and a second IV group element which are different from each other, and formed on a gate insulated film on a semiconductor substrate, and a second region composed of a multiple element compound including at least the first and second IV group elements and metal, and formed on the first region; and (b) a silicide electrode formed in contact with the second region of the gate electrode, composed of the first IV group element and metal, and being substantially free from the second IV group element.

This semiconductor integrated circuit in which the second region of the gate electrode of the IGFET is composed of the multiple element compound is as effective as the semiconductor circuit having the second feature.

In accordance with a fourth feature, a method of manufacturing a semiconductor integrated circuit having an IGFET, wherein a gate electrode of the IGFET is manufactured by the steps of: (a) forming, on a gate insulated film on a semiconductor substrate, a first region composed of at least a first IV group element and a second IV group element which are different from each other, and forming, on the first region, a second region composed of the first IV group element; and (b) forming a silicide electrode through silicidation of at least a part of the second region of the gate electrode.

With the foregoing method, the silicide electrode is formed through silicidation of at least a part of the second region composed of the first IV group element, and is substantially free from the second IV group element (e.g. Ge or C). It is therefore possible to reduce resistivity of the silicide electrode without increasing the number of manufacturing steps. Alternatively, the silicide electrode may be made through silicidation of the second region completely, and be in direct contact with the first region of the gate electrode. In such a case, the silicide electrode is also substantially free from the second IV group element.

According to a fifth feature of the invention, a method of manufacturing a semiconductor integrated circuit including IGFETs comprises the steps of: (a) forming, on a gate insulated film, a first region composed of at least a first IV group element and a second IV group element which are different from each other, and forming, on the first region, a second region composed of the first IV group element, thereby obtaining a first gate electrode for an IGFET of a first conductive channel type and a second gate electrode for another IGFET of a second conductive channel type; (b) introducing a first conductive impurity into the first gate electrode and a second conductive impurity into the second gate electrode; and (c) forming a silicide electrode through silicidation of at least a part of the second region of the first gate electrode and at least a part of the fourth region of the second region. The step (b) is the same as a step of introducing a first conductive impurity into a source or drain electrode of the first conductive channel type IGFET. Further, the step (b) is the same as a step of introducing a second conductive impurity into the source or drain electrode of the second conductive channel type IGFET.

Further, in the complementary IGFET, the gate electrodes having the first and second regions are produced in the same manufacturing step, which is effective in reducing the number of manufacturing steps compared with when the gate electrodes are separately prepared in the complementary IGFET. Further, with the complementary IGFET, this method is effective in producing the semiconductor integrated circuit having the first and fourth features.

According to a sixth feature of the invention, a semiconductor integrated circuit comprises: (a) a semiconductor region of a first conductive type; (b) an epitaxial growth layer formed on a semiconductor region and including a first region composed of at least a first IV group element and a second IV group element that are different from each other, and a second region composed of the first IV group element; and (c) a silicide electrode formed on the second region of the epitaxial growth layer.

The semiconductor region is a source or drain electrode of the IGFET, and the epitaxial growth layer is an elevated source or drain electrode.

The first IV group element of the elevated source or drain electrode is Si, the second IV group element of the elevated source or drain electrode is Ge or C.

A composition ratio of Ge in the first region of the elevated source or drain electrode is preferably at least 0.1 or more, and a thickness of the first region is at least 2 nm from the semiconductor region.

The silicide electrode is made of a $CoSi_y$ or $TiSi_y$ layer which is substantially free from Ge.

In the case of a complementary IGFET, the elevated source or drain electrode on the main electrodes of the p-channel IGFET preferably contains at least B. The elevated electrode on the main electrodes of the n-channel IGFET preferably contains at least As.

In this semiconductor integrated circuit, the presence of the second IV group element in the epitaxial growth layer, i.e., the first region of the elevated electrode, is effective in reducing the diffusion speed of the impurity doped in the elevated electrode, particularly B as the p-type impurity. Since the junctions of the semiconductor region formed by diffusion of the impurity from the elevated electrode can be made shallow, both the source electrode and the drain electrode (main electrode) can be also made shallow, which is effective in improving integration of the semiconductor circuit. Further, the active concentration of the p-type impurity in the elevated electrode is large compared with in Si electrode, which raises carrier concentration (hole concentration) in the elevated electrode. Therefore, it is possible to reduce resisitivity of the and power source voltage of the elevated electrode, and to accelerate the circuit operation of the semiconductor circuit and power consumption thereof. Still further, the silicide electrode substantially free from the second IV group element has low resistivity, which is effective in accelerating the switching operation of the IGFET and reduce power consumption thereof. As a result, the semiconductor integrated circuit can accelerate its circuit operation and reduce its power consumption. If the elevated electrode in contact with the silicide electrode contains the second IV group element, an energy gap there between can be reduced, and a height of a Schottkey barrier can be also decreased. This is effective in lowering the contact resistance between the elevated electrode and the silicide electrode. The semiconductor integrated circuit can accelerate its circuit operation and reduce its power consumption.

In accordance with a seventh feature, a method of manufacturing a semiconductor integrated circuit comprises the steps of: (a) forming a semiconductor region on a main surface of a semiconductor substrate; (b) forming on the semiconductor region an epitaxial growth layer which includes a first region composed of a first IV group element and a second IV group element which are different from each other, and forming on the first region a second region composed of the first IV group element; and (c) forming a silicide electrode through silicidation of at least a part of the second region of the epitaxial growth layer.

In the foregoing method, the silicide electrode is substantially free from the second IV group element (e.g. Ge or C) since it is formed through silicidation of the second region composed of the first IV group element. Therefore, it is possible to reduce resistivity of the silicide electrode without increasing the number of manufacturing steps. Alternatively, the second region of the epitaxial growth layer may be subject to silicidation so that the silicide electrode may be in contact with the first region of the epitaxial growth layer. In such a case, the silicide electrode is also substantially free from the second IV group element.

According to an eighth feature of the invention, a semiconductor integrated circuit manufacturing method comprises the steps of: (a) forming a main electrode of an IGFET; (b) forming, on the main electrode, a first region composed of a first IV group element and a second IV group element which are different from each other, and forming, on the first region, a second region composed of the first IV group element, thereby forming an elevated electrode (epitaxial growth layer); and (c) forming a silicide electrode through silicidation of a part of the second region of the elevated electrode.

This method is as effective as the method according to the seventh feature.

In accordance with a ninth feature of the invention, a semiconductor integrated circuit comprises: (a) an IGFET including a gate electrode provided with a first region which is composed of at least a first IV group element and a second IV group element which are different from each other and formed on a gate insulated film of a semiconductor substrate, and a second region which is composed of the first IV group element and formed on the first region, and a main electrode, (b) an elevated electrode formed on the main electrode, and having a third region composed of a third IV group element and a fourth IV group element which are different from each other and a fourth region formed on the third region and composed of the third IV group element; (c) a first silicide electrode formed in contact with the second region of the gate electrode, and being substantially free from the second IV group element; and (d) a second silicide electrode formed in contact with the fourth region of the elevated electrode, and being substantially free from the fourth IV group element.

The semiconductor integrated circuit is as effective as the semiconductor integrated circuits having the first, second and sixth features.

In accordance with a tenth feature of the invention, a method of forming a semiconductor integrated circuit including an IGFET, comprising the steps of: (a) forming, on a gate insulated film on a semiconductor substrate, a first region composed of a first IV group element and a second IV group element which are different from each other, and forming, on the first region, a second region composed of the first IV group element, and forming a main electrode, thereby obtaining the IGFET, (b) forming, on the main electrode, a third region composed of a third IV group element and a fourth IV group element which are different from each other, and forming, on the third region, a fourth region composed of the third IV group element; (c) forming a first silicide electrode through silicidation of at least a part of the second region of the gate electrode, the silicide electrode being substantially free from the second IV group element; and (d) forming a second silicide electrode through silicidation of at least a part of the fourth region of the elevated electrode simultaneously with the step (c), the second silicide electrode being substantially free from the fourth IV group element.

The foregoing method can produce the semiconductor integrated circuit which is as effective as the semiconductor circuit having the fourth and seventh features.

BRIEF DESCRIPTION OF THE DRAWINGS

FIG. 3(A) is a detailed sectional view of the essential part of an n-channel IGFET of the first embodiment.

FIG. 3(B) is a detailed sectional view of the essential part of a p-channel IGFET in the first embodiment.

FIG. 4 shows the relationship between a depth from a gate electrode surface and a composition ratio of SiGe, in the first embodiment.

FIG. 34 to FIG. 41 are sectional views showing steps for manufacturing a semiconductor integrated circuit in the fifth embodiment.

DETAILED DESCRIPTION OF THE PREFERRED EMBODIMENTS

The invention will be described with reference to the preferred embodiments shown on the accompanying drawings.

First Embodiment
<Device Structure>

Figure 1:
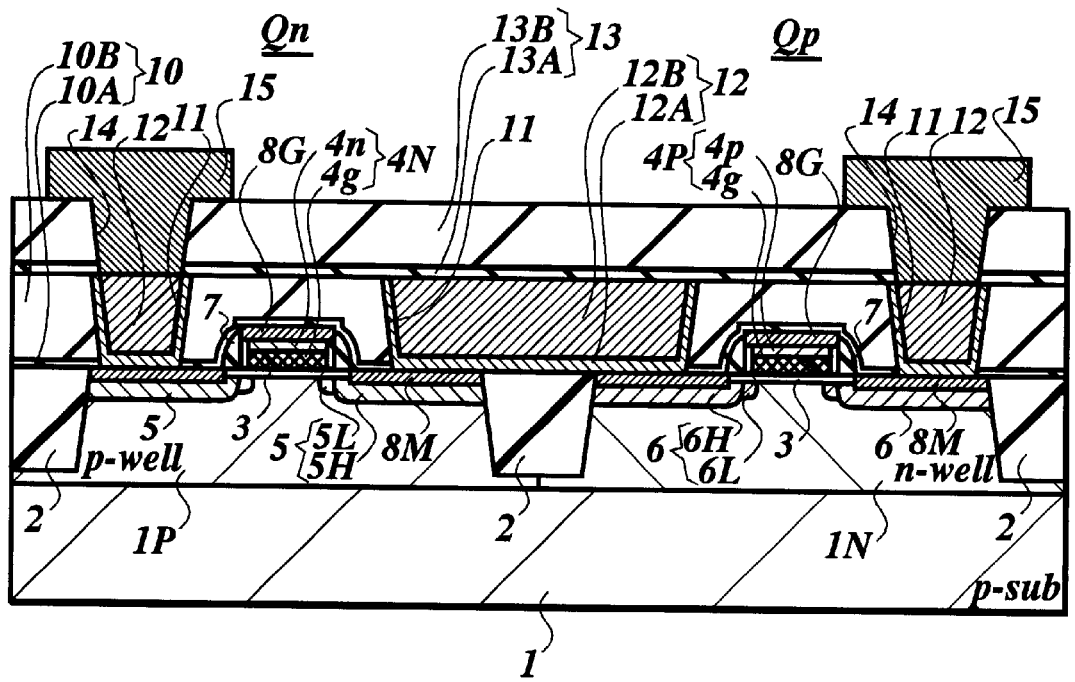
FIG. 1 is a sectional view of a complementary IGFET in a semiconductor circuit according to a first embodiment of the invention.
Figure 2:
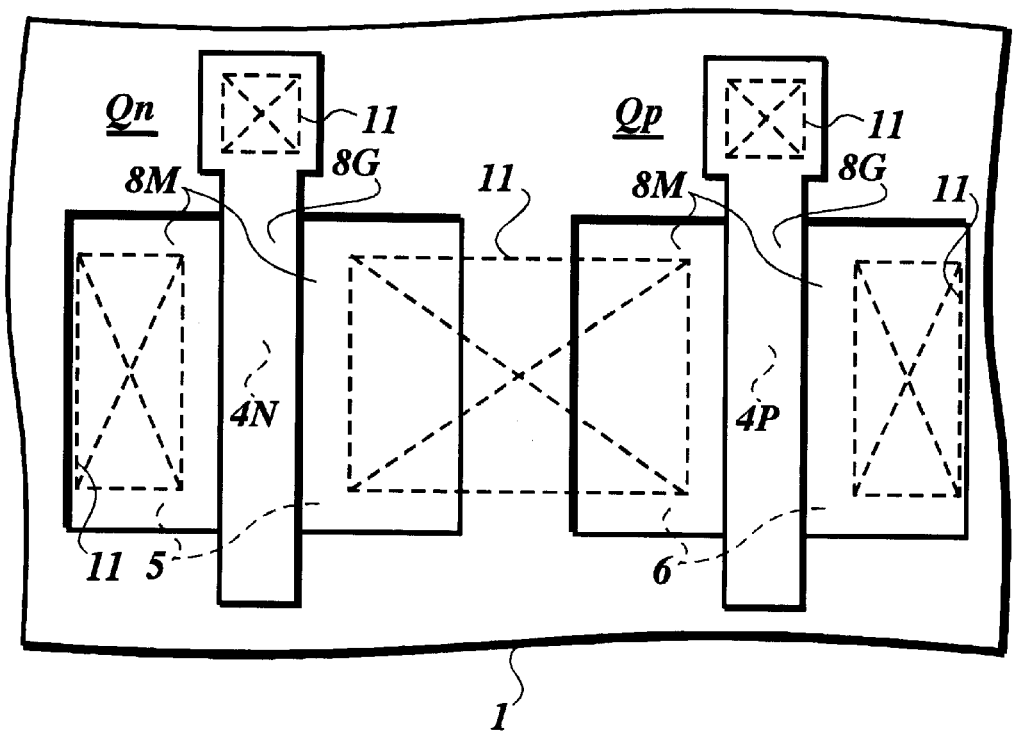
FIG. 2 is a top plane view of the complementary IGFET of the first embodiment.

FIG. 1 is a sectional view of a complementary IGFET of a semiconductor integrated circuit according to the first embodiment of the invention, and FIG. 2 is a top plan view of the complementary IGFET. Referring to FIGS. 1 and 2, the semiconductor integrated circuit mainly comprises a p-type semiconductor substrate 1 composed of single crystal Si having a low impurity concentration, and has on the surface thereof provided with a complementary IGFET which constitutes a logic circuit or a memory circuit.

An n-channel IGFET Qn of the complementary IGFET is formed on a main surface of a p-well region 1P in an area surrounded by an element isolation region 2. The n-channel IGFET Qn is provided with the p-well region 1P used as a channel region, a gate insulated film 3, a gate electrode (control electrode) 4N, and a pair of main electrodes 5 functioning as a source electrode and a drain electrode.

The p-well region 1P is formed on the main surface of the semiconductor substrate 1, and has a low impurity concentration. The element isolation region 2 is formed by the STI (Shallow Trench Isolation) process which is optimum for minimization, and has a trench formed on the main surface of the semiconductor substrate 1, and an insulating film (e.g. $SiO_2$ film) embedded in the trench and having a flat top. Alternatively, the element isolation region 2 may be constituted by a field isolation film (e.g. using LOCOS (Local Oxidation of Silicon)).

FIG. 3(A) is a detailed sectional view of the essential part of the n-channel IGFET Qn. A gate insulated film 3 of the n-channel IGFET Qn is made of a 5 nm-thick $SiO_2$ film. Alternatively, a nitride film, an oxynitride film or the like may be used as the n-channel IGFET Qn.

In this embodiment, the gate electrode 4N includes a lower first region 4g formed in contact with the gate insulated film 3, and a upper second region 4n formed on the first region 4g. The second region 4n is not in contact with the gate insulated film 3. The first region 4g is composed of at least two different elements belonging to the IV element group. Specifically, the first region 4g is composed of $Si_{1-x}Ge_x$, i.e. Si and Ge belong to the IV element group. The second region 4n is made only of Si of the IV element group. Since the dual gate structure is adopted for the complementary IGFET in the embodiment, the gate electrode 4N of the n-channel IGFET Qn is doped using an n-type impurity, i.e. As is actually used.

As shown in FIG. 1, the n-channel IGFET Qn has the extended source-drain structure. Each of the main electrode 5 includes an n-type semiconductor region 5H having a high impurity concentration, and an n-type semiconductor region 5L having a low impurity concentration and formed between the semiconductor region 5H and the channel forming region. The semiconductor region 5L is self-aligned with respect to the gate electrode 4N. The semiconductor region 5H is self-aligned with respect to the gate electrode 4N and a gate side wall 7 on the gate electrode 4N.

In this n-channel IGFET Qn, in order to accomplish low resistivity, a silicide electrode 8G is electrically connected to the gate electrode 4N, and a silicide electrode 8M is electrically connected to the main electrode 5. The silicide electrode 8G is positioned on the second region 4n of the gate electrode 4N as shown in FIGS. 1 and 3(A). The silicide electrode 8G is formed through silicidation of at least a part of the second region 4n of the gate electrode 4N. This silicidation is performed in a salicidation process for producing the silicide electrode 8N on the main electrodes 5. In this embodiment, the silicide electrode 8G is made of a $CoSi_y$ film. Alternatively a $TiSi_y$ film may be used for the silicide electrode 8G. The silicide electrode 8M is formed on the main electrodes 5, i.e. the semiconductor region 5H having the high impurity concentration. Specifically, the semiconductor region 5H is subject to the silicidation (salicidation) in order to form the silicide electrode 8M. The silicide electrode 8M is made of a $CoSi_y$ film similarly to the silicide electrode 8G since it is produced together with the silicide electrode 8G.

The p-channel IGFET Qp of the complementary IGFET Qp is formed on the main surface of the n-well region 1N in the area surrounded by the element isolation region 2, as shown in FIGS. 1 and 2. The p-channel IGFET Qp is constituted by the n-well region 1N used as the channel forming region, gate insulated film 3, gate electrode (control electrode) 4P, and a pair of main electrodes 6 functioning as source and drain electrodes. The n-well region 1N is present on the main surface of the semiconductor substrate 1 at a position separate from the p-well region 1P, and has a relatively low impurity concentration.

FIG. 3(B) is a detailed sectional view of the essential part of the p-channel IGFET Qp. The gate insulated film 3 of the p-channel IGFET Qp is formed on the same insulated layer in the process for making the gate insulated film 3 of the n-channel IGFET Qn. The gate insulated film 3 is made of a $SiO_2$ film, for example.

Similarly to the gate electrode 4N of the n-channel IGFET Qn, the gate electrode 4P of the p-channel IGFET Qp includes a lower first region 4g in contact with the gate insulated film 3, and a upper second region 4p formed on the first region 4g and being spaced from the gate insulated film 3. In this embodiment, the first region 4g is made of $Si_{1-x}Ge_x$, while the second region 4p is made of Si. With the dual gate electrode structure, the gate electrode 4P of the p-channel IGFET Qp is doped by a p-type impurity, e.g. B is utilized in practice.

The p-channel IGFET Qp has the extended source-drain structure as shown in FIG. 1. Each of the main electrodes 6 is constituted by a p-type semiconductor region 6H having a high impurity concentration, and a p-type semiconductor region 6L having a low impurity concentration and formed between the semiconductor region 6H and the channel forming region. The semiconductor region 6L is self-aligned with respect to the gate electrode 4P. The semiconductor region 6H is self-aligned with the gate electrode 4P and a gate side wall 7 provided on the gate electrode 4P.

In order to reduce the resistivity of the foregoing p-channel IGFET Qp similarly to the n-channel IGFET Qn, the silicide electrode 8G is electrically connected to the gate electrode 4P while the silicide electrode 8M is electrically connected to the main electrodes 6. Referring to FIG. 1 and FIG. 3(B), the silicide electrode 8G is formed through silicidation (salicidation) of at least a part of the upper part of the second region 4p of the gate electrode 4P. On the other hand, the silicide electrode 8M is formed through silicidation of the upper part of the semiconductor region 6H of the main electrodes 6. Both of the silicide electrodes 8G and 8M are made of $CoSi_y$ films.

FIG. 4 shows a composition ratio of SiGe depending upon depths ($\mu$m) of the gate electrodes 4N and 4P from their surfaces (before salicidation). In this embodiment, the gate electrodes 4N and 4P have a thickness of 0.15 $\mu$m. The first region 4g is 0.05 $\mu$m thick, and has the composition ratio 0.84 of Si, and the composition ratio 0.16 of Ge. In other words, the first region 4g is composed of $Si_{0.86}Ge_{0.16}$. The second regions 4n and 4p have a thickness of 0.10 $\mu$m, and the composition ratio 1.0 of Si.

Figure 5:
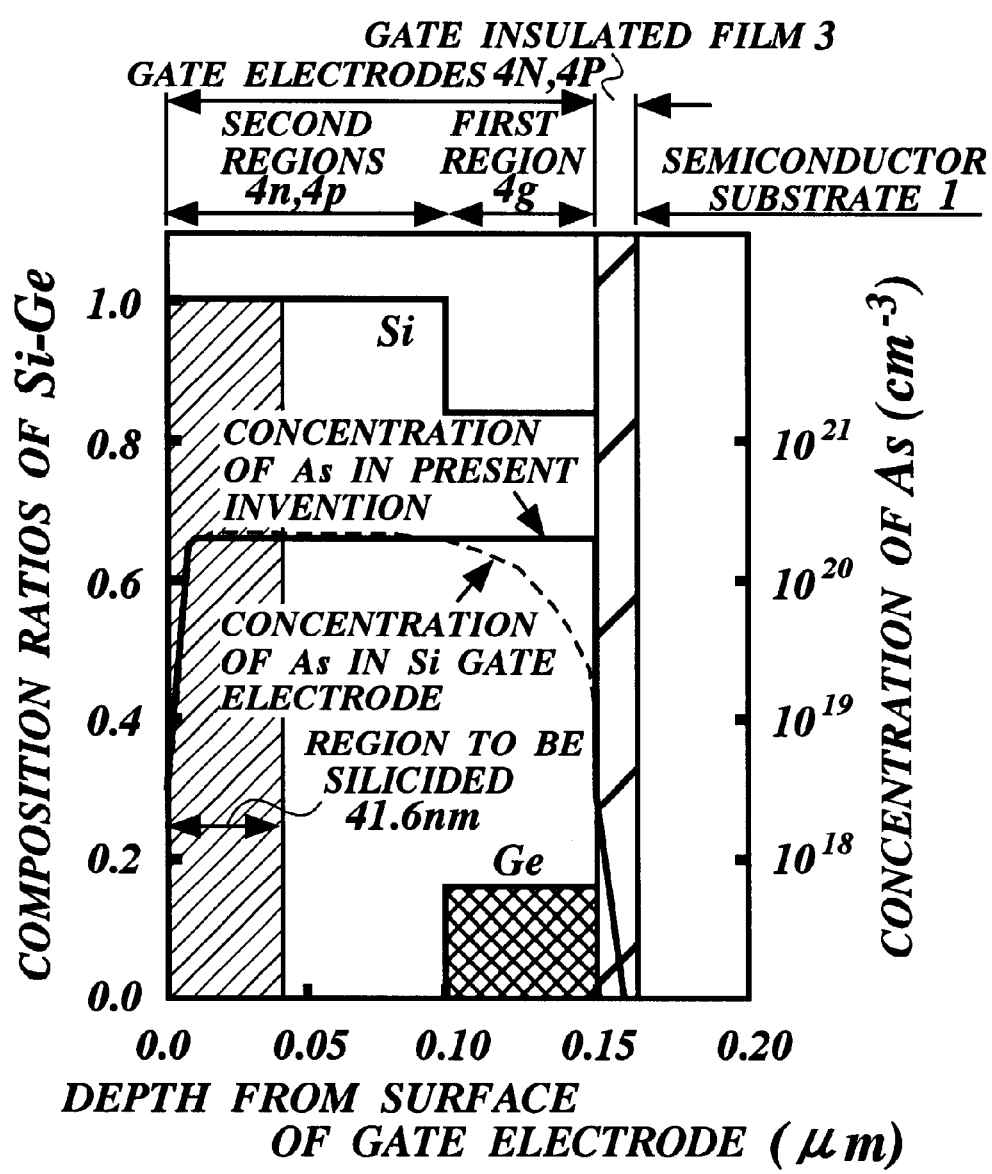
FIG. 5 shows the relationship between a depth from the gate electrode surface, a composition ratio of SiGe, and a concentration of As in the first embodiment.

FIG. 5 shows a composition ratio of SiGe and a concentration of As depending upon depths ($\mu$m) of the gate electrodes 4N and 4P from their surfaces (before salicidation). The concentration distribution of As as the n-type impurity (donor) represents the concentration distribution of As that is accomplished when As that is doped into the gate electrode 4N by ion implantation is actively annealed. Doping of As into the gate electrode 4N is performed in the ion implantation process which is used for forming the high impurity semiconductor region 5H of the main electrodes 5. Active annealing of the As is executed in the process for actively annealing the main electrodes 5. In FIG. 5, solid lines denote the concentration of As of the gate electrode 4N which has the first region 4g composed of SiGe. A broken line denotes the concentration of As of an Si gate electrode. Having a low diffusion speed, As doped via the front surface of the gate electrode is not sufficiently diffused to an area near the gate insulated film 3 of the Si gate electrode. This causes a reduced concentration of As near the gate insulated film 3, formation of a depletion layer near the gate insulated film in response to the application of a gate bias, lowered controllability of a threshold voltage of a MOSFET, and reduced operation speed of the MOSFET.

In the n-channel IGFET Qn of this embodiment, the first region 4g composed of SiGe is positioned near the gate insulated film 3 of the gate electrode 4N, so that addition of Ge increases the diffusing speed of As near the gate insulated film 3. Therefore, the sufficient concentration of As can be maintained all over the first region 4g, i.e. over the gate insulated film 3. A diffusion coefficient of As in $Si_{0.86}Ge_{0.16}$ is approximately 2.5 times as large as a diffusion coefficient of As in the Si gate electrode, at a temperature of 1000° C. With respect to an increase of diffusion coefficient of As in response to an increase in the composition ratio of Ge, Refer to "Nucl. Instru. Method, B 120 161–164 (1996)" by A. Nylandsted, S. Yu. Shiryaev, P. Gaiduk, and V. S. Tishkov. FIG. 5 shows the concentration distribution of As when the segregation coefficient of As is 1 in Si and in $Si_{0.86}Ge_{0.16}$. Therefore, the first region 4g has to be thicker than a region where a depletion layer is formed in the Si gate electrode.

With the Si gate electrode, since a 0.5 nm-thick depletion layer is formed in the gate electrode when the gate insulated film is 5 nm thick, the first region 4g preferably has a thickness of at least 2 nm or larger. Further, the composition ratio of Ge of the first region 4g is preferably 0.1 or more in order to increase the diffusion coefficient of As.

Referring to FIGS. 1 and 3(A), the silicide electrode 8G is formed on the second region 4n of the gate electrode 4N. At least a part of the upper surface of the second region 4n is subject to the silicidation (salicide (self-aligned silicide)) in order obtain the silicide electrode 8G, as shown in FIGS. 4 and 5. Specifically, the silicidation is executed only on the second region 4n, so that the silicide electrode 8G is substantially free from Ge (or C) which raises resistivity. For instance, a 3.63 nm-thick Si film reacts against a 1 nm-thick Co film, thereby producing a 3.49 nm-thick $CoSi_2$ film. Therefore, a 41.6 nm-thick Si film should be utilized. In this embodiment, the second region 4n, which is thicker than 41.6 nm and has its Si consumed for the silicidation, is formed on the first region 4g. For instance, refer to "Mat. Res. Soc. Symp. Proc. Vol. 320, 397–402 (1994)" by Z. Wang, Y. L. Chen, H. Ying, R. J. Nemanichi, and D. E. Sayers, which describes that a silicide layer containing Si and Ge has resistivity higher than that of a silicide layer containing Si.

Figure 6:
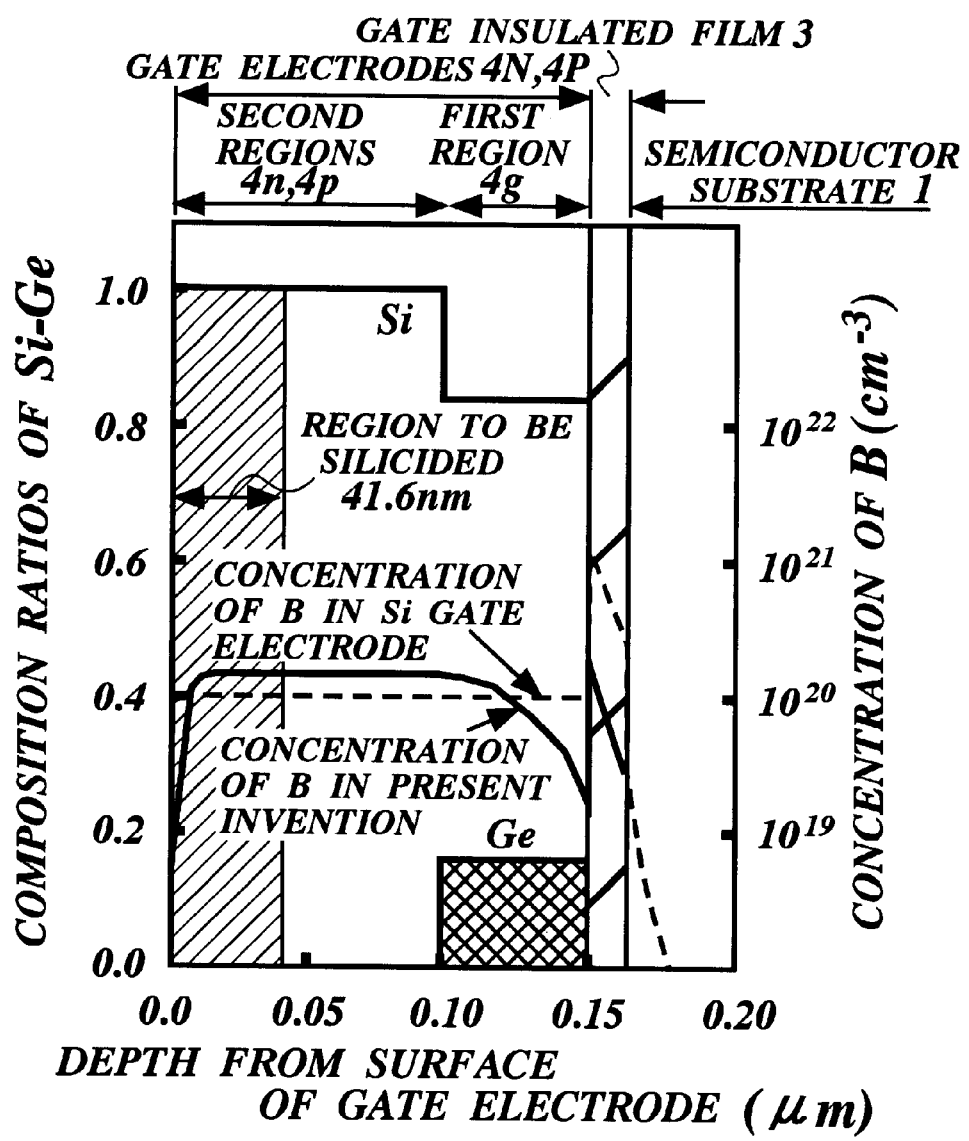
FIG. 6 shows the relationship between a depth from a gate electrode surface, a composition ratio of SiGe, and a concentration of B in the first embodiment.

FIG. 6 shows the relationship between the composition ratio of SiGe and concentration of B depending upon depths ($\mu$m) of the gate electrode 4P from the surface (before the silicidation) of the p-channel IGFET Qp. The concentration distribution of B as the n-type impurity (acceptor) represents the concentration distribution of B that is accomplished when B that is doped into the gate electrode 4P by ion implantation is actively annealed. Doping of B into the gate electrode 4P is performed in the ion implantation process which is used for forming the high impurity semiconductor region 6H of the main electrodes 6. Active annealing of the B is executed in the process for actively annealing the main electrodes 6. In FIG. 6, solid lines denote a concentration of B in the gate electrode 4P having the first region 4g composed of SiGe, and a broken line denotes the concentration of B in the Si gate electrode. In this Si gate electrode, the diffusion speed of B is higher than that of As, and since F in doped $BF_2$ promotes diffusion of B in the gate insulated film, B doped in the gated electrode tends to leak to the channel forming region. Leakage of B reduces the controllability of the threshold voltage of the MOSFET.

In the p-channel IGFET Qp of the embodiment, the first region 4g composed of SiGe is positioned near the gate insulated film 3 of the gate electrode 4P. Addition of Ge is effective in reducing the diffusion speed of B near the gate insulated film 3. Therefore, B is prevented from leaking to the channel forming region from the gate electrode 4P via the gate insulated film 3 (i.e. B punches through the gate insulated film 3). The diffusion coefficient of B in $Si_{0.86}Ge_{0.16}$ is reduced to approximately 0.5 to 0.1 times of the diffusion coefficient of B in Si, at a temperature of 1000° C. Therefore, it is possible to reduce the amount of B diffused into the gate insulated film 3, and effectively suppress leakage of B into the channel forming region. Refer to "Appl. Phys. Lett. 66 580–582 (1995)" by Kuo, J. L. Hoyt, and J. F. Gibbons with respect to reduction of the diffusion coefficient of B in accordance with an increase of the composition ratio of Ge. FIG. 6 shows the concentration distribution of B when the segregation coefficient of B in Si and in $Si_{0.86}Ge_{0.16}$ is 1 (one). Therefore, the first region 4g should be thick enough to prevent leakage of B which occurs in the Si electrode. In order to meet this requirement, the first region 4g is designed to have a thickness of 2 nm or larger, and the composition ratio of Ge being 0.1 or larger.

As shown in FIGS. 1 and 3(B), the second region 4p of the gate electrode 4P is provided with the silicide electrode 8G as in the gate electrode 4N of the foregoing n-channel IGFET Qn, i.e. the silicide electrode 8G is formed through silicidation of at least a part of the top of the second region 4p as shown in FIGS. 4 and 6. The silicide electrode 8G is substantially free from Ge (or C) which increases resistivity. In the gate electrode 4P, the second region 4p which has a thickness of 41.6 nm or more since Si is consumed for the silicidation is formed on the first region 4g.

Referring back to FIG. 1, a wiring 15 is electrically connected to the main electrodes 5 of the n-channel IGFET Qn via the silicide electrode 8M and a contact plug electrode (embedded electrode) 12. Further, another wiring 15 is electrically connected to the main electrodes 6 of the p-channel IGFET Qp via the silicide electrode 8M and another contact plug electrode 12.

Each of the contact plug electrode 12 is embedded in a connection hole 11 formed in an insulated inter-layer film 10 covering the n-channel IGFET Qn and p-channel IGFET Qp. In both of the n-channel IGFET Qn and p-channel IGFET Qp, the contact plug electrodes 12 are positioned in the same conductive layer and are made of the same conductive material. In this embodiment, each contact plug electrode 12 is constituted by a Ti (titanium) film 12A and a W (tungsten) film 12B laid over the Ti film 12A. The insulted inter-layer film 10 is constituted by a $Si_3N_4$ film 10A and a BPSG film 10B, for example.

Each of the wirings 15 is provided on the insulated inter-layer film 13 covering each contact plug electrode 12, and is connected to the contact plug electrode 12 via a connection hole 14 formed in the insulated inter-layer film 13. In the n-channel IGFET Qn and p-channel IGFET Qp, the wirings 15 are positioned in the same conductive layer and are made of the same conductive material. In this embodiment, the wirings 15 are constituted by a Ti film, a TiN film, an Al—Cu film (or Al—Si film or Al—Cu—Si film), a Ti film, and a TiN film which are laid over one after another. The insulated inter-layer film 13 is constituted by an $Si_3N_4$ film 13A and a TEOS film 13B.

Although not shown in FIG. 1, the wirings 15 are also connected to the gate electrode 4N of the n-channel IGFET Qn and the gate electrode 4P of the p-channel IGFET Qp via the silicide electrode 8G and contact plug electrodes 12.

<Manufacturing Process>

The semiconductor integrated circuit including the IGFET will be manufactured by the processes shown in FIGS. 7 to 19.

(1) First of all, there is prepared a p-type semiconductor substrate 1 made of single crystal Si and having a low impurity concentration. A p-well region 1P is formed at an area for an n-channel IGFET Qn on the main surface of the semiconductor substrate 1, and an n-well region 1N is formed at an area for a p-channel IGFET Qp on the main surface of the semiconductor substrate 1 (see FIG. 7).

Figure 7:
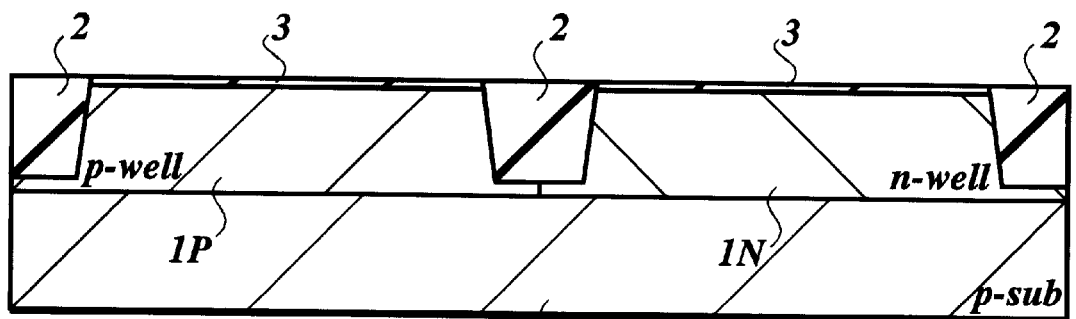
FIG. 7 is a sectional view of a first step for manufacturing the semiconductor integrated circuit according to the first embodiment.

(2) A trench is formed between element forming areas including IGFETs, and an insulator is embedded in the trench, thereby forming an element isolation region 2 (see FIG. 7). The trench is preferably formed by the anisotropic etching such as RIE (Reactive Ion Etching). An $SiO_2$ film prepared by the CVD or sputtering can be used as the insulator, and is smoothed by the etch-back process, chemical-mechanical polishing process (CMP), or the like.

The element isolation region 2 may be formed after making semiconductor elements such as the n-channel IGFET Qn and p-channel IGFET Qp. Alternatively, the element isolation region 2 may be mainly constituted by a field oxide film.

(3) As shown in FIG. 7, a gate insulated film 3 is prepared on the main surface of the semiconductor substrate 1 in the areas for the n-channel IGFET Qn and p-channel IGFET Qp. In this embodiment, the gate insulated film 3 is constituted by an $SiO_2$ film which has been prepared by thermal oxidation in which the semiconductor substrate 1 is heated in an oxidation atmosphere. The gate insulated film 3 has a thickness determined in accordance with a required threshold voltage, and is 2.5 nm thick in this embodiment. It is preferable that a dopant is applied to the channel forming region prior to the formation of the gate insulated film 3, in order to control the threshold voltage.

Figure 8:
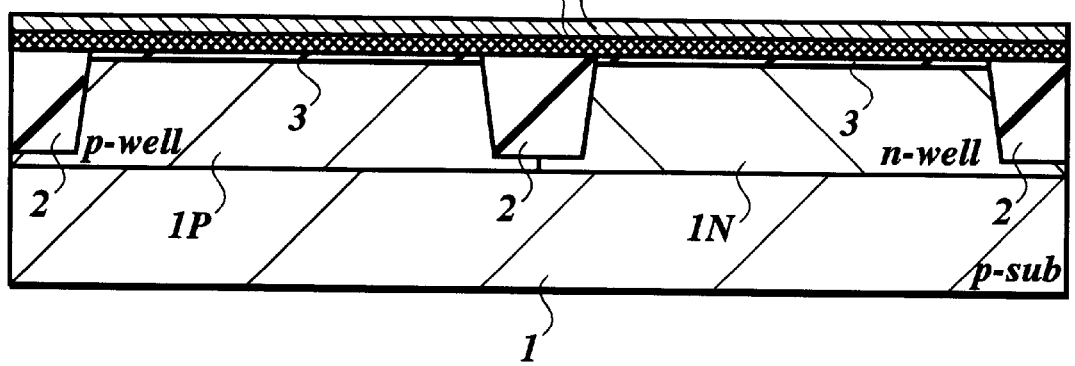
FIG. 8 is a sectional view of a second step for manufacturing the semiconductor circuit in the first embodiment.

(4) Referring to FIG. 8, a gate electrode forming layer 40 is provided all over the semiconductor substrate 1 including the gate insulated film 3. The gate electrode forming layer 40 is produced by the CVD method in which a mixture of silane gas ($Si_2H_6$) and germane gas ($GeH_4$) is used as a source gas. With the CVD method, partial pressure and film forming temperature of the $Si_2H_6$ and $GeH_4$ gases are appropriately controlled, and a composition ratio of Ge is varied in accordance with a distance from the gate insulated film 3, thereby obtaining the gate electrode forming layer 40, which includes a first region 4g made of $Si_{1-x}Ge_x$, and a second region 4m made of Si. In this state, the second region 4m is not doped with an n-type impurity and a p-type impurity.

The first region 4g is formed under the following conditions: a flow rate of $Si_2H_6$ gas being 5 sccm; a flow rate of $GeH_4$ gas being 1 sccm; a film forming pressure being $1.3 \times 10^2$ Pa; a film forming temperature being 500° C.; and a film forming period being 10 minutes. Therefore, the first region 4g is made of an $Si_{0.86}Ge_{0.16}$ film having the composition ratio of Ge being 0.16, and is 0.05 µm thick. The second region 4m is produced under the same conditions as those for the first region 4g with respect to the $Si_2H_6$ gas, but the flow rate and film forming period of $GeH_4$ gas are changed to 0 sccm and 28 minutes, respectively. Under these conditions, the second region 4m has the composition ratio of Ge being 0 (zero) and the composition ratio of Si being 1.0, i.e. the second region 4m is an Si film substantially free from Ge. The second region 4m is 0.10 µm thick. In this embodiment, since the flow rate of the $GeH_4$ gas is abruptly changed to 0 sccm from 1 sccm, the composition ratio of Ge is sharply reduced at a distance of 0.05 µm from the gate insulated film 3. The second region 4m is required only to have the composition ratio of Ge being 0 (zero) at least at a position consumed for forming the silicide electrode 8G through silicidation (salicidation).

Alternatively, the first region 4g may be formed by the CVD method in which a mixture of $SiH_4$ gas and $Ge_2H_6$ gas is used as the source gas. Further, the first region 4g may be formed by the MBE (Molecular Beam Epitaxy).

Figure 9:
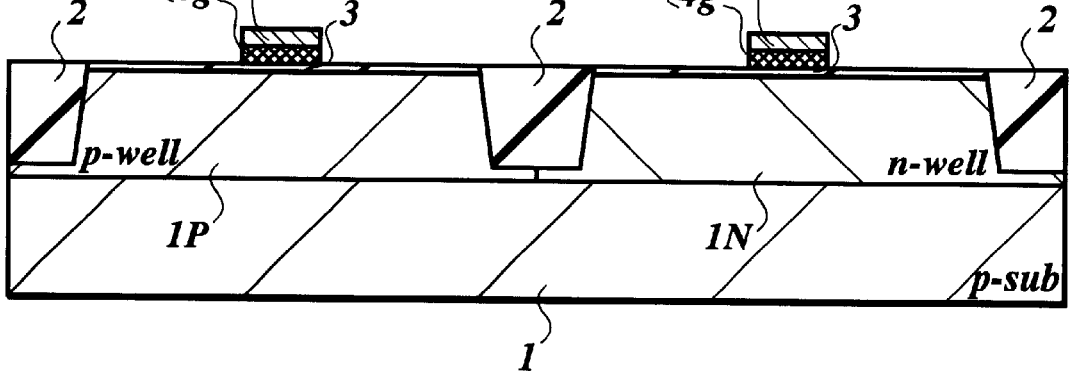
FIG. 9 is a sectional view of third step for manufacturing the semiconductor circuit in the first embodiment.
Figure 10:
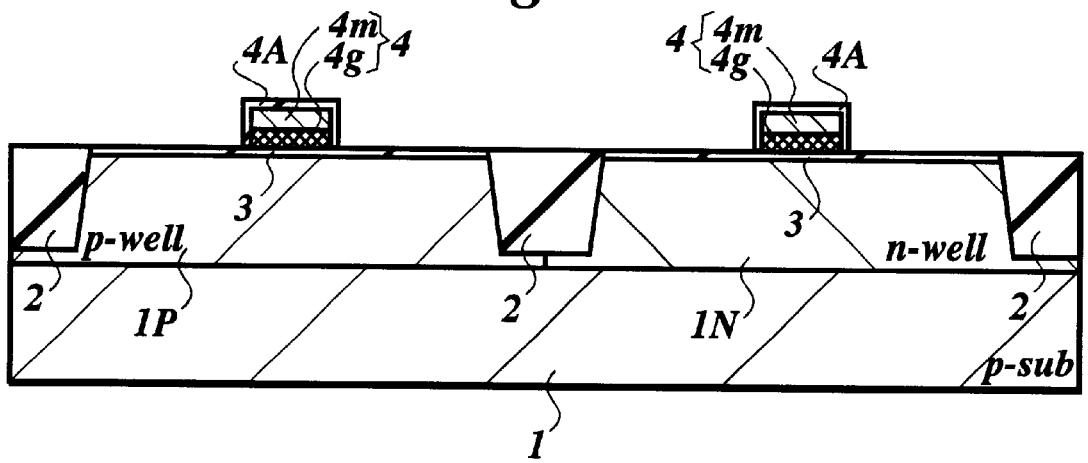
FIG. 10 to FIG. 19 are sectional views showing further steps for manufacturing the semiconductor integrated circuit in the first embodiment.
Figure 11:
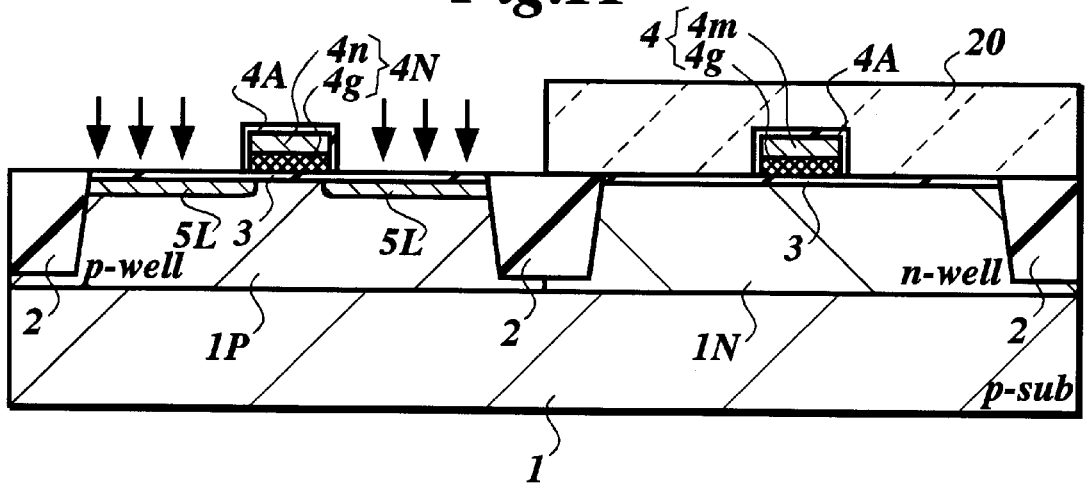
Figure 12:
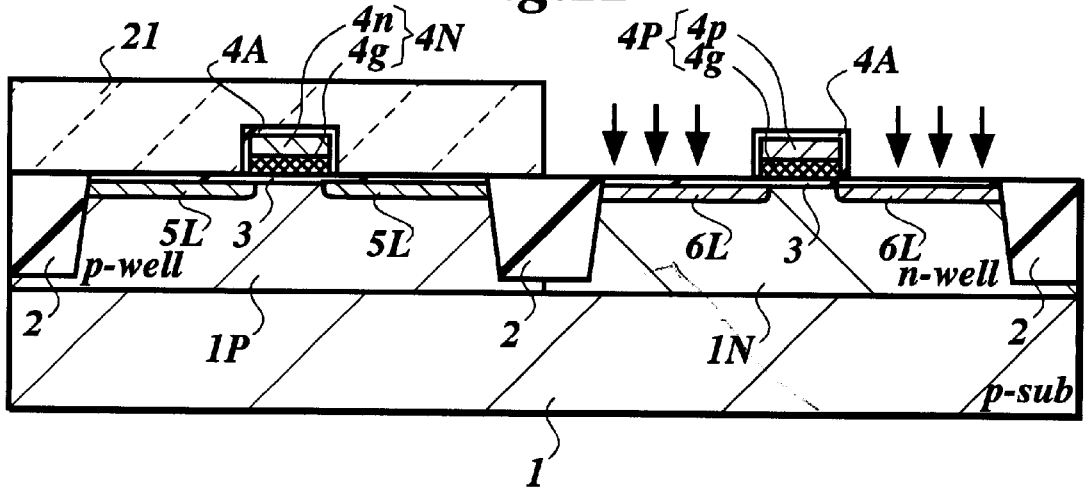

(5) The gate electrode forming layer 40 is patterned in order to produce a gate electrode 4 at positions where an n-channel IGFET Qn and a p-channel IGFET Qp are to be made, as shown in FIG. 9. A width and a length of the gate electrode 4 are determined in accordance with a size and electrical characteristics of an IGFET to be produced. The gate electrode forming layer 40 is patterned using a mask prepared by a photolithography technique and anisotropic etching such as RIE.

(6) An insulated film 4A for covering the gate electrode 4 is then formed, and is constituted by a $SiO_2$ film prepared by the thermal oxidation or a $SiO_2$ film prepared by the CVD.

(7) Next, an extended source/drain process will be started. First of all, an n-type semiconductor region 5L having a low impurity concentration is formed on the n-channel IGFET Qn forming area in order to make a pair of main electrodes 5 which are used as a source electrode and a drain electrode. An n-type impurity is doped to the main surface of the p-well region 1P by the ion implantation, by using a mask 20, which covers the gate electrode 4, element isolation region 2 and p-channel IGFET Qp forming area, as an anti-impurity implantation mask. The mask 20 is a resist mask prepared by the photolithography process. The n-type impurity is As which has a low diffusion speed and is suitable for shallowing. Generally speaking, an amount of implantation energy for ion-implanting As is 10 keV to 50 keV, and dose is $10^{14}$ atoms/cm$^2$–$10^{15}$ atoms/cm$^2$. In this embodiment, the implantation energy is 15 keV, and dose is $10^{14}$ atoms/cm$^2$.

(8) A p-type semiconductor region 6L having a low impurity concentration is formed on the p-channel IGFET Qp forming area in order to make a pair of main electrodes 6 which are used as a source electrode and a drain electrode. A p-type impurity is doped to the main surface of the n-well region 1N by the ion implantation, by using a mask 21, which covers the gate electrode 4, element isolation region 2 and n-channel IGFET Qn forming area, as an anti-impurity implantation mask. The mask 21 is a resist mask prepared by the photolithography process, similarly to the mask 20. The p-type impurity is BF$_2$ which can make implanted ions distributed shallowly and is suitable for shallowing. The amount of implantation energy for ion-implanting BF$_2$ is 10 keV, and dose is $10^{14}$ atoms/cm$^2$. The p-type impurity is actually either B ions or B molecular ions.

After ion-implanting As and BF$_2$, the semiconductor substrate 1 is preferably annealed in order to recover a damaged surface thereof and activate the impurity.

Figure 13:
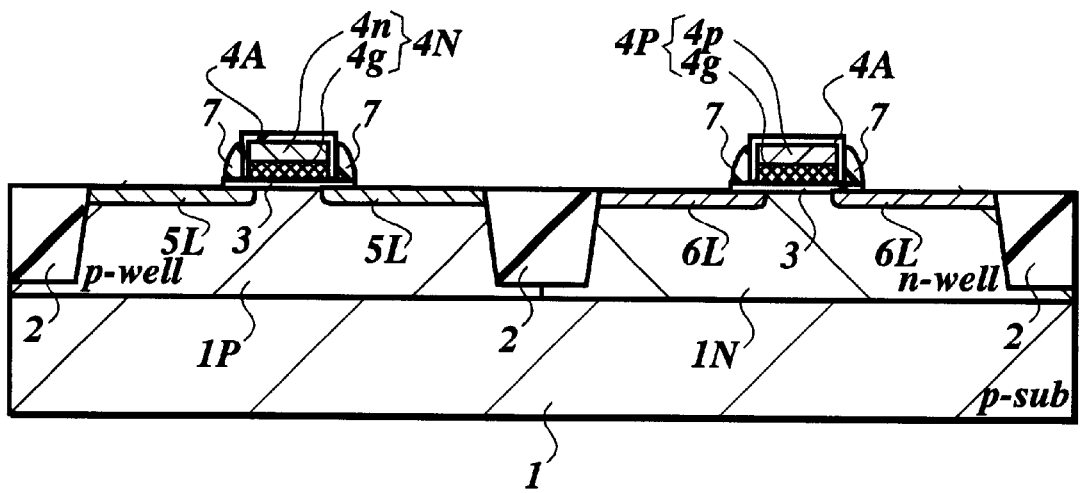

(9) As shown in FIG. 13, a gate side wall 7 is formed, via the insulated film 4A, on a side wall of the gate electrode 4 at areas for the n-channel IGFET Qn and p-channel IGFET Qp. In this embodiment, the gate side wall 7 is made of a Si$_3$N$_4$ film which is prepared all over the semiconductor substrate 1 by a low pressure CVD, sputtering or the like, and is subject to the anisotropical etching such as RIE in accordance with a thickness of the Si$_3$N$_4$ film.

Figure 14:
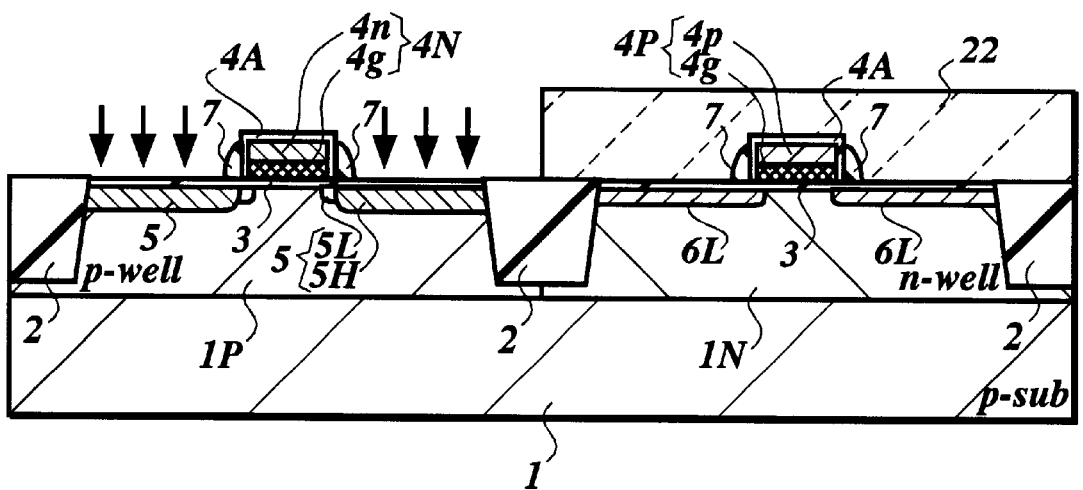

(10) Referring to FIG. 14, an n-type semiconductor region 5H having a high impurity concentration is prepared in order to make a pair of main electrodes 5 at the n-channel IGFET Qn forming area. The semiconductor region 5H is formed on the main surface of the p-well region 1P by doping the n-type impurity through the ion implantation, with the gate electrode 4, gate side wall 7, element isolation region 2 and a mask 22 used as an anti-impurity implantation mask. The mask 22 covers the p-channel IGFET Qp. The complementary IGFET of this embodiment has the dual gate structure, and the n-type impurity is doped into the gate electrode 4, thereby obtaining the gate electrode 4N which includes the first and second regions 4g and 4n doped with the n-type impurity. The mask 22 is a resist mask prepared by the photolithography. As is used as the n-type impurity since it has a low diffusion speed and is suitable for shallowing. Implanting energy and dose of As is 50 keV and 3×10$^{15}$ atoms/cm$^2$, respectively.

Figure 15:
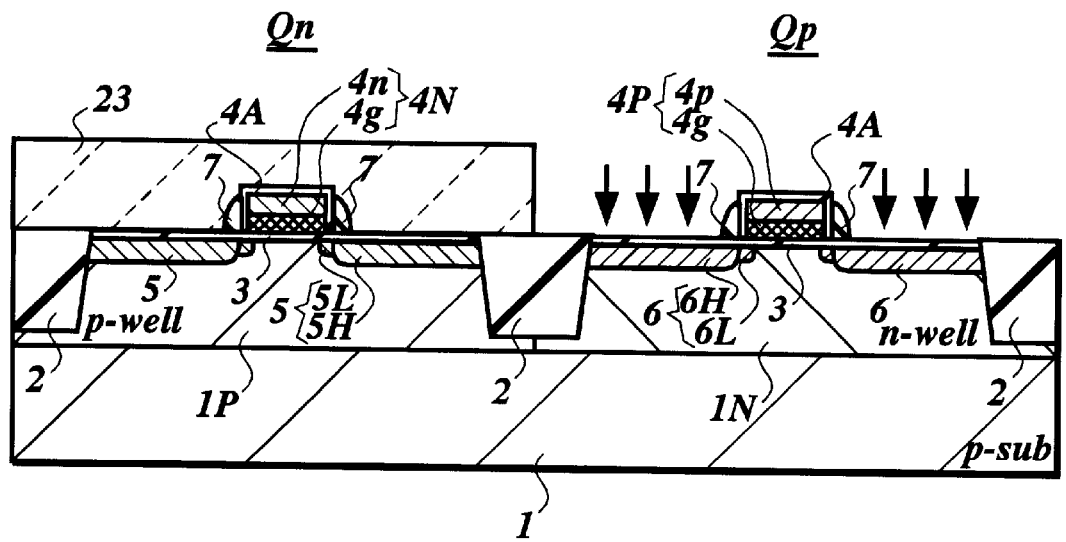

(11) Referring to FIG. 15, a p-type semiconductor region 6H having a high impurity concentration is formed in order to obtain a pair of main electrodes 6 on the p-channel IGFET Qp forming area. The semiconductor region 6H is formed on the main surface of the n-well region 1N by doping the p-type impurity through the ion implantation, with the gate electrode 4, gate side wall 7, element isolation region 2 and a mask 23 used as an anti-impurity implantation mask. The mask 23 covers the p-channel IGFET Qp. This embodiment adopts the dual gate structure, so that it is possible to obtain the gate electrode 4P which includes the first region 4g and second region 4n doped with the p-type impurity. The mask 23 is a resist mask prepared by the photolithography. BF$_2$ is used as the p-type impurity since it has a shallow ion implantation distribution and is suitable for shallowing. Implanting energy and dose of BF$_2$ is 40 keV and 3×10$^{15}$ atoms/cm$^2$, respectively.

(12) The main electrodes 5 and 6 are activated by undergoing the RTA (Rapid Thermal Annealing) in an N$_2$ gas for ten seconds at a temperature of 1000° C. Therefore, the main electrodes 5 having the semiconductor regions 5L and 5H will be formed, thereby substantially completing the n-channel IGFET Qn. In the channel forming region of the n-channel IGFET Qn, the acceptor concentration is approximately 10$^{17}$ atoms/cm$^2$–10$^{18}$ atoms/cm$^3$, the donor concentration of the main electrodes 5 is approximately 10$^{19}$ atoms/cm$^3$–10$^{21}$ atoms/cm$^3$, and a junction depth of the main electrodes 5 is approximately 50 nm–200 nm. Having the dual gate structure, the gate electrode 4N of the n-channel IGFET Qn is set to the n-type, is of a surface channel type, and is suitable for suppressing short channel effects, promoting the high speed operation, and minimization. The main electrodes 6 including the semiconductor regions 6L and 6H are also annealed, thereby substantially completing the p-channel IGFET Qp. In the channel forming region of the p-channel IGFET Qp, the donor concentration is approximately 10$^{17}$ atoms/cm$^3$–10$^{18}$ atoms/cm$^3$, the acceptor concentration of the main electrodes 6 is approximately 10$^{19}$ atoms/cm$^3$–10$^{21}$atoms/cm$^3$, and a junction depth of the main electrodes 6 is approximately 50 nm–200 nm. Having the dual gate structure, the gate electrode 4P of the P-channel IGFET Qp is set to the p-type, is of a surface channel type, and is suitable for suppressing short channel effects, promoting the high speed operation, and minimization.

Figure 16:
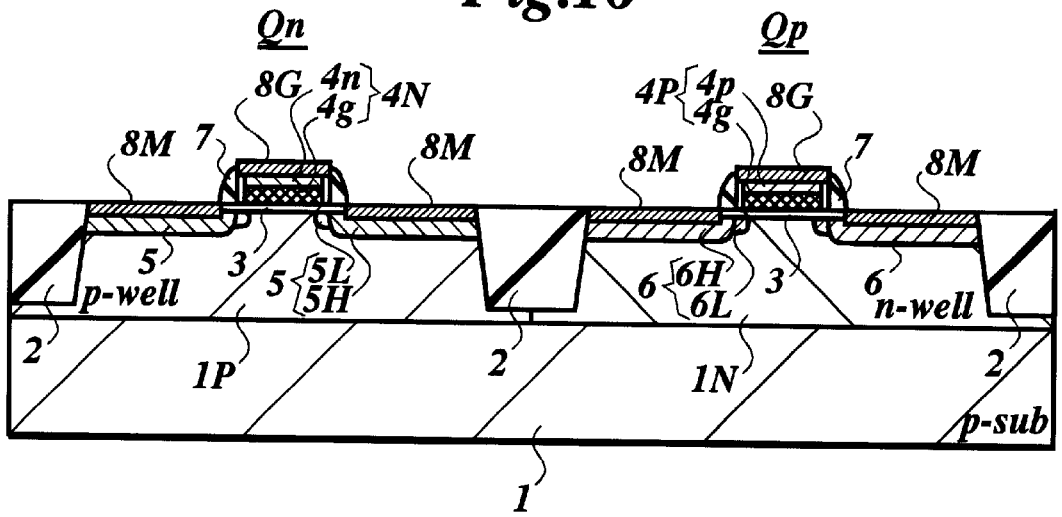

(13) As shown in FIG. 16, in the n-channel IGFET Qn, the silicide electrode 8G and 8M are formed on the gate electrode 4N and main electrodes 5, respectively. Further, in the p-channel IGFET Qp, the silicide electrodes 8G and 8M are formed on the gate electrode 4P and the main electrodes 6, respectively. These silicide electrodes 8G and 8M are made of CoSi$_y$ films prepared through salicidation. The CoSi$_y$ films are formed as follows. First of all, insulated films are removed from the surfaces of the gate electrodes 4N and 4P, and the main electrodes 5 and 6, thereby exposing the second region 4n of the gate electrode 4N, the second region 4p of the gate electrode 4P, the semiconductor region 5H of the main electrodes 5, and the semiconductor region 6H of the main electrodes 6. Thereafter, a Co film is prepared all over the semiconductor substrate 1, and a TiN film is formed thereon as a cap layer. Both the Co and TiN films are formed by sputtering. The Co film is 11.5 nm thick, for example. The Co film undergoes silcidation through two annealing steps, i.e. it is first annealed in non-oxide atmosphere at 500° C. for 60 seconds in order remove the TiN film and non-reactive Co film, and is then annealed at 750° C. for 30 seconds. Thus, the silicide electrodes 8G and 8M having the thickness of 40 nm will be prepared. The two-step annealing process is adopted in order to execute phase transition from CoSi to CoSi$_2$. After the first annealing, the non-active Co film is removed in order to prevent the silicide electrodes 8G and 8M from being bridged on the gate side wall 7. The annealing steps are executed by the RTA, in which a mixture of sulfuric acid and hydrogen peroxide is actually used to remove the non-reactive Co film.

As described so far, in the n-channel IGFET Qn, the silicide electrode 8G is prepared through silicidation of a part of the second region 4n composed of Si only, and is free from Ge. Therefore, the silicide electrode 8G has low resistivity. Further, with the complementary IGFET, the gate electrode 4N of the p-channel IGFET Qp having the first and second regions 4g and 4n, and the gate electrode 4P of the p-channel IGFET Qp having the first and second regions 4g and 4 can be prepared in the same steps, respectively.

Figure 17:
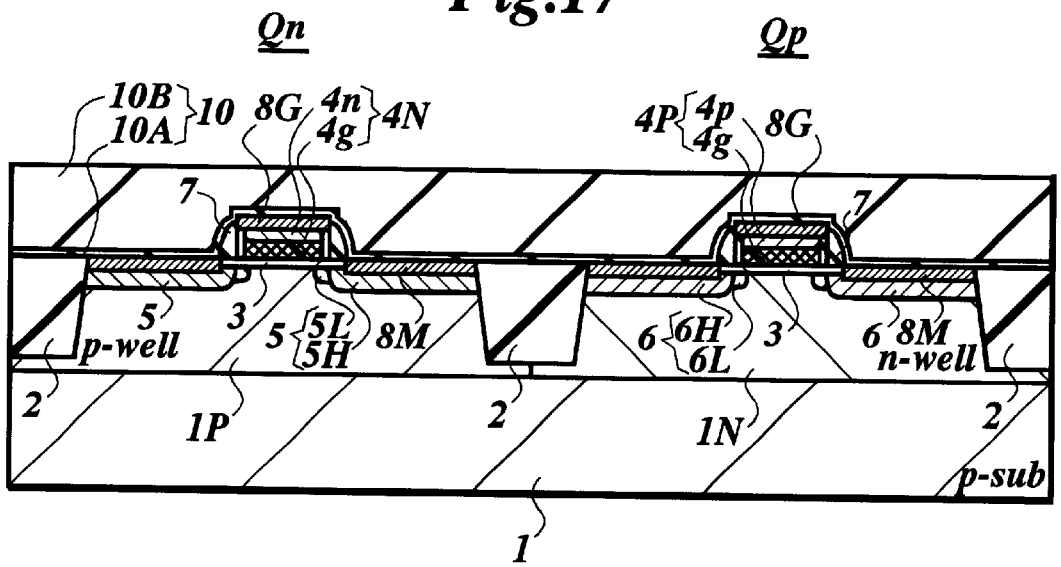

(14) Referring to FIG. 17, the inter-layer film 10 is prepared all over the semiconductor substrate 1, and includes an $Si_3N_4$ film 10A prepared by the sputtering, and a BPSB film 10B prepared by the CVD which are laid over one after another. The inter-layer film 10 has its surface smoothed by chemical-mechanical polishing process.

Figure 18:
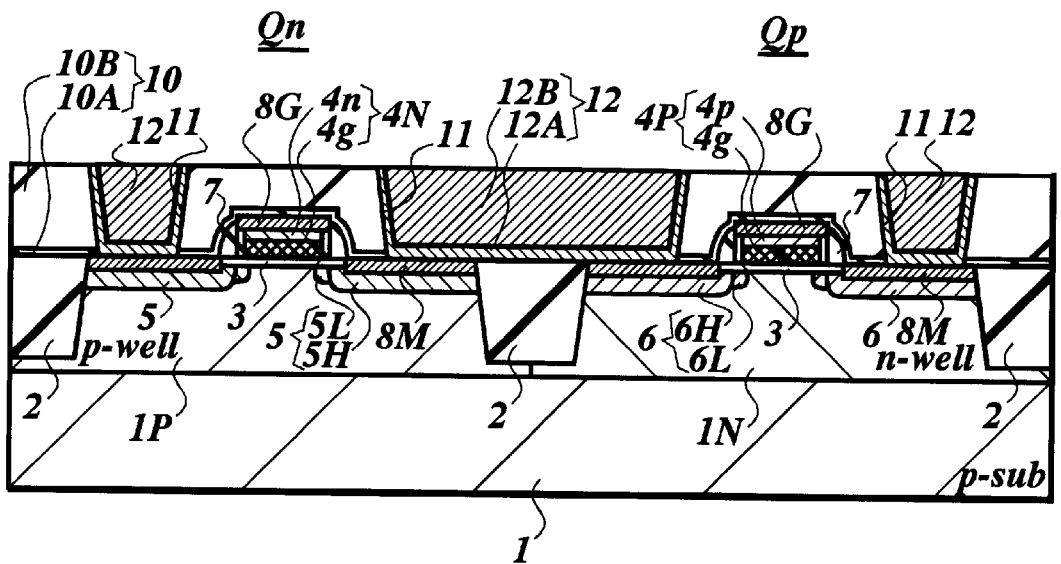

(15) Connection holes 11 are made in the inter-layer film 10 covering the silicide electrodes 8G and 8M of the n-channel IGFET Qn, and the silicide electrodes 8G and 8M of the p-channel IGFET Qp. Contact plug electrodes 12 are embedded in the connection holes 11 as shown in FIG. 18. Each contact plug electrode 12 includes a Ti film 12A prepared by the sputtering, and a W film 12B prepared by the selective CVD which is laid over the Ti film 12A. The contact plug electrodes 12 are embedded in the connection holes 11 by chemical-mechanical polishing the surface of the W film 12B.

Figure 19:
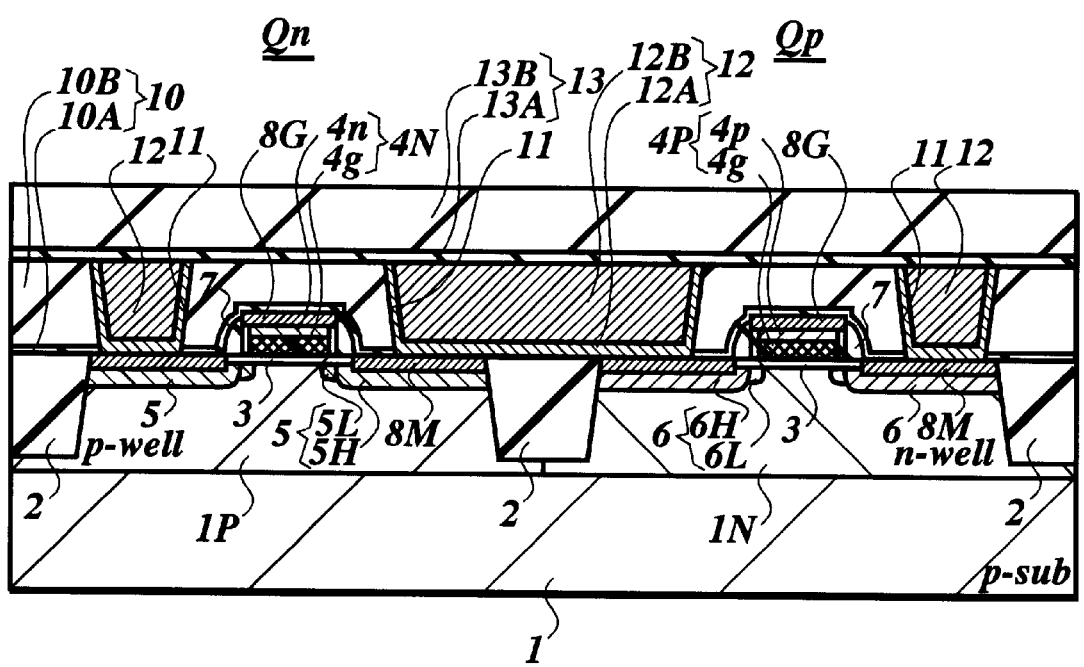

(16) As shown in FIG. 19, an insulated inter-layer film 13 are prepared all over the insulated inter-layer film 10. The insulated inter-layer film 13 includes a $Si_3N_4$ film 13A prepared by the sputtering and a TEOS film 13B prepared by the plasma CVD laid over the $Si_3N_4$ film 13A.

(17) Connection holes 14 are made in the insulated inter-layer film 13 on the contact plug electrodes 12 (see FIG. 1). Wirings 15 are prepared on the insulated inter-layer film 13 and are electrically connected to the contact plug electrodes 12 via the connection holes 14. In this embodiment, each of the wirings 15 is made of a Ti film, a TiN film, an Al—Cu film(or Al—Si film or Al—Cu—Si film), a Ti film, and a TiN film which are laid over one after another. All of these films are prepared by the sputtering. Alternatively, the wirings 15 may be damascene wirings produced by the damascene process. The semiconductor integrated circuit of the invention will be completed after a series of the foregoing manufacturing steps.

In this semiconductor integrated circuit, the first region 4g, which is positioned near the gate insulated film 3 of the gate electrode 4P of the p-channel IGFET Qp, contains the second IV group element, i.e. Ge (or C since the first region 4g is made of a SiGe or SiC film). It is therefore possible to reduce the diffusing speed of B as the p-type impurity in the first region 4g, and prevent the leakage of B into the channel forming area. Further, it is possible to stabilize the threshold voltage of the p-channel IGFET Qp, and to improve electrical stability of the semiconductor integrated circuit. Still further, the first region 4g, which is positioned near the gate insulated film 3 of the gate electrode 4N of the n-channel IGFET Qn, contains the second IV group element, i.e. Ge (or C since the first region 4g is made of a SiGe or SiC film). It is therefore possible to increase the diffusing speed of As as the n-type impurity in the first region 4g, and maintains sufficient impurity concentration of As all over the gate electrode 4N, particularly near the gate insulated film 3. Further, it is possible to prevent the gate electrode 4N from changing into a depletion layer, to stabilize the threshold voltage of the p-channel IGFET Qp, and to improve electrical stability of the semiconductor integrated circuit. Especially, in the semiconductor integrated circuit including the complementary IGFET of the dual gate structure, the gate electrode 4 (including the lower first region 4g and the upper second region 4m) containing the first and second IV group elements is effective in stabilizing the threshold voltages of both of the p-channel and n-channel IGFETs. Therefore, the IGFETs can be further minimized, thereby promoting further integration of the semiconductor integrated circuit.

The silicide electrode 8G is prepared through silicidation of the second region 4p of the gate electrode 4P of the p-channel IGFET Qp and the second region 4n of the gate electrode 4N of the n-channel IGFET Qp. Since the second regions 4n and 4p are substantially free from Ge as the second IV group element, the silicide electrode 8G also does not contain the second IV group element, and has low resistivity. As a result, it is possible to accelerate the switching operation of the p-channel IGFET Qp and n-channel IGFET Qn, reduce the power source voltage, and accelerate the circuit operation and reduce power consumption of the semiconductor integrated circuit.

With respect to the manufacturing method for the semiconductor integrated circuit, only the source gas has to be controlled in order to produce the gate electrode 4P, which includes the second region 4p of the p-channel IGFET Qp substantially free from the second IV group element, and the second region 4n of the n-channel IGFET Qn substantially free from the second IV group element. The silicide electrode 8G is prepared through silicidation of at least parts of the second regions 4n and 4p, and is substantially free from the second IV group element. As a result, the silicide electrode 8G having low resistivity can be produced without an increase in the manufacturing steps.

Further, in the complementary IGFET, the gate electrodes 4 having the first and second regions 4g and 4m are produced in the same manufacturing step, which is effective in reducing the number of manufacturing steps compared with when the gate electrodes are separately prepared in the complementary IGFET.

Second Embodiment

Figure 20:
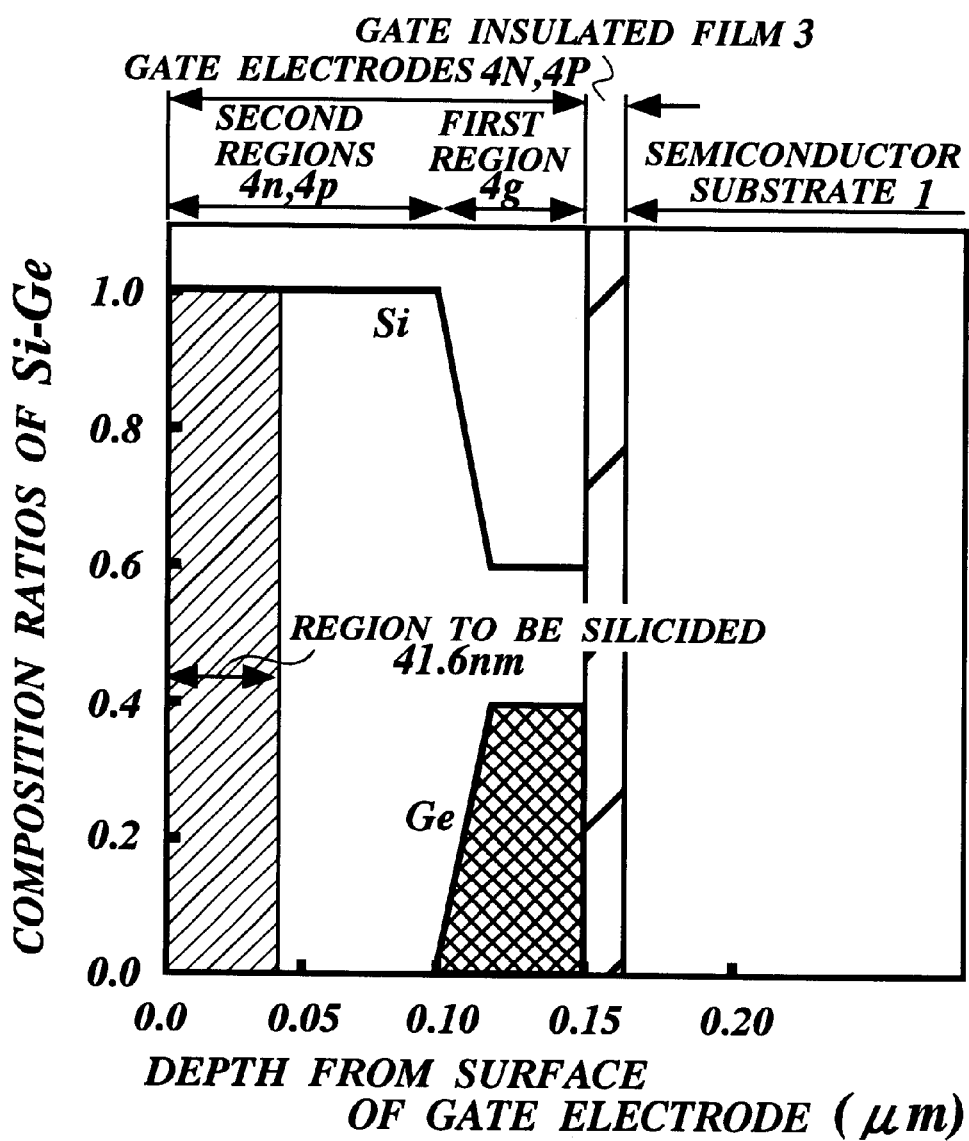
FIG. 20 shows the relationship between a depth from a gate electrode surface and a composition ratio of SiGe in a second embodiment of the invention.
Figure 21:
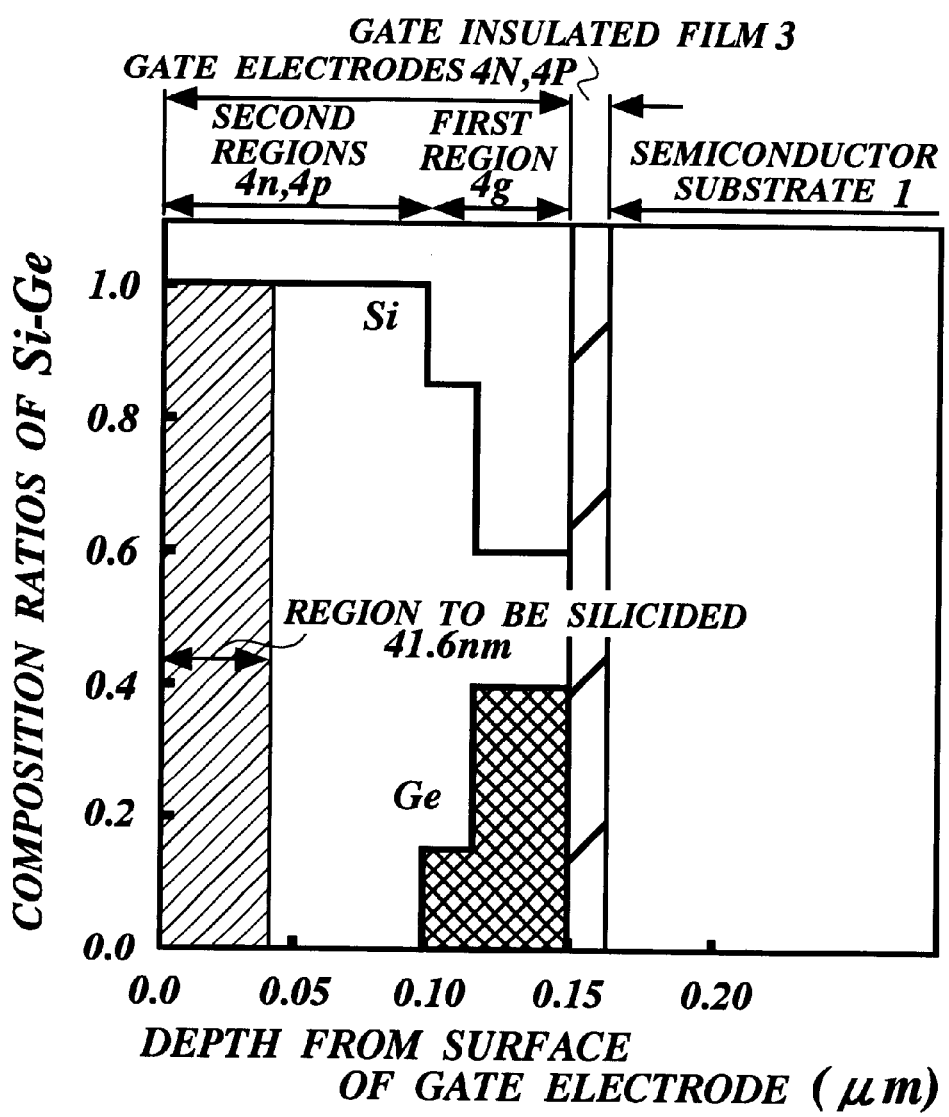
FIG. 21 shows the relationship between a depth from a gate electrode surface and a composition ratio of SiGe in a second embodiment of the invention.

In a second embodiment, the composition ratio of the IV group element of a gate electrode of an IGFET is made to vary in accordance with a distance from a gate insulated film. FIGS. 20 and 21 show the composition ratio of SiGe depending upon the depth ($\mu$m) from surfaces (before salicidation) of a gate electrode 4N of an n-channel IGFET Qn and a gate electrode 4P of a p-channel IGFET Qp in the second embodiment.

The gate electrodes 4N and 4P shown in FIG. 20 are 0.15 $\mu$m thick similarly to the gate electrodes 4N and 4P in the first embodiment. A first region 4g of the gate electrodes 4N and 4P is 0.05 $\mu$m thick. The composition ratio of Si in the first region 4g is maintained constant to a predetermined distance from a gate insulated film 3, and is then continuously and moderately increased in accordance with a distance from the gate insulated film 3. The composition ratio of Si is 0.60 near the gate insulated film 3 and is 1.0 near a second region 4n or 4p. In response to the variation of the composition ratio of Si, the composition ratio of Ge is continuously and moderately reduced in accordance with a distance from the gate insulated film 3. The composition ratio of Ge is 0.40 near the gate insulated film 3 while it is 0 (zero) near the second region 4n or 4p. The first region 4g in which the composition ratio of SiGe continuously varies can be easily produced by gradually reducing a flow rate of a $GeH_4$ gas in the CVD process.

The gate electrodes 4N and 4P shown in FIG. 21 are 0.15 $\mu$m thick similarly to the gate electrodes 4N and 4P in the first embodiment. The first region 4g is 0.05 m thick. The composition ratio of Si in the first region 4g is maintained constant to a predetermined distance from the gate insulated film 3, and is then stepwise increased in accordance with a distance from the insulated gate film 3. The composition ratio of Si is 0.60 near the gate insulated film 3 and finally becomes 1.0 near a second region 4n or 4p of the gate electrode 4. In response to the variation of the composition ratio of Si, the composition ratio of Ge is stepwise reduced in accordance with a distance from the gate insulated film 3. The composition ratio of Ge is 0.40 near the insulated gate film 3 while it is 0 (zero) near the second region 4n or 4p. The first region 4g in which the composition ratio of SiGe stepwise varies can be easily produced by stepwise reducing a flow rate of a $GeH_4$ gas in the CVD process.

In the second embodiment, the first region 4g composed of SiGe is present directly on the gate insulated film 3. Alternatively, an Si or Ge film which is 1 nm or less thick, i.e. thinner than the first region 4g, and substantially free from Ge or Si may be formed between the gate insulated film 3 and the first region 4g. The presence of the Si or Ge film is effective in suppressing the diffusion of B doped into the gate electrode 4P, and promoting, in the first region 4g, the diffusion of As doped into the gate electrode 4N. If the gate insulated film 3 is made of an $SiO_2$ film, the Si film can prevent the $SiO_2$ film from being adversely affected by Ge contained in the first region 4g. Further, if there is the Ge film, it can effectively suppress the diffusion of B doped into the gate electrode 4P. The Ge film is useful when the gate insulated film 3 is made of a nitride film.

The foregoing semiconductor integrated circuit is as effective as the semiconductor integrated circuit according to the first embodiment.

Third Embodiment

In a third embodiment of the invention, gate electrodes of an IGFET have a structure different from those of the foregoing embodiments. FIG. 22(A), FIG. 22(B), FIG. 22(C), FIG. 22(D) and FIG. 22(E) are detailed sectional views of the essential part of an n-channel IGFET Qn in the third embodiment.

Figure 22:
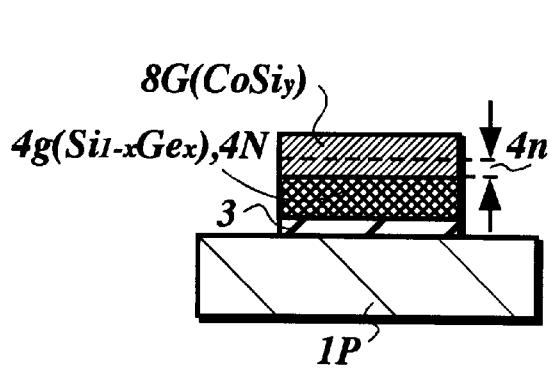
FIG. 22(A), FIG. 22(B), FIG. 22(C), FIG. 22(D) and FIG. 22(E) are detailed sectional views of an essential part of an n-channel IGFET in a semiconductor integrated circuit according to a third embodiment of the invention.
Figure 22:
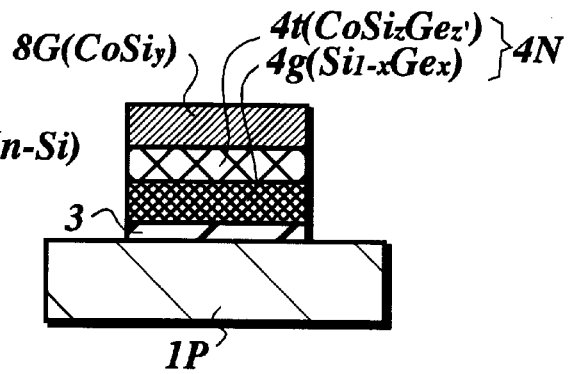
Figure 22:
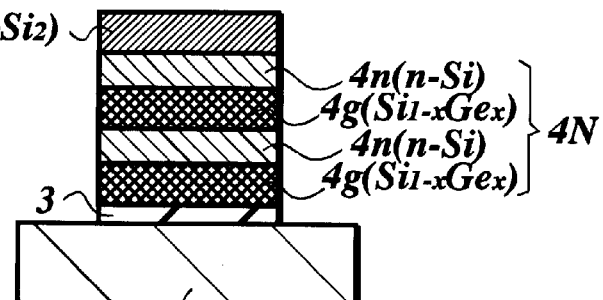
Figure 22:
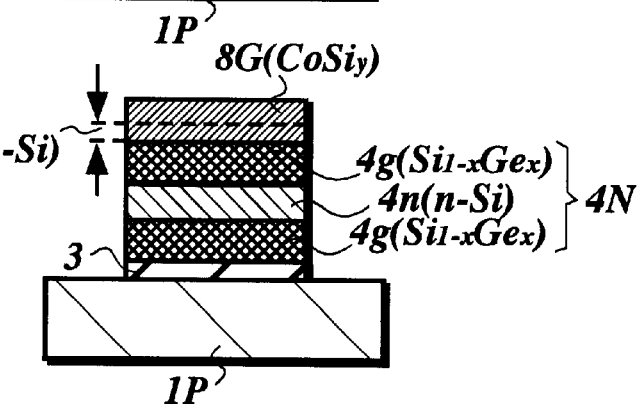
Figure 22:
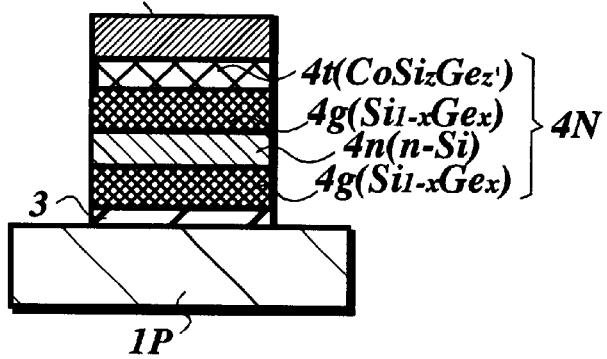

FIG. 22(A) shows the structure of the n-channel IGFET Qn after a silicide electrode 8G is prepared. A gate electrode 4N includes only a first region 4g made of SiGe. A silicide electrode 8G is laid on the gate electrode 4N. Prior to the production of the silicide electrode 8G (i.e. before silicidation), a second region 4n made of Si is present on the gate electrode 4N. In other word, the silicide electrode 8G is produced by completely consuming the second region 4n for silicidation. Therefore, the silicide electrode 8G is substantially free from Ge, and has low resistivity similarly to the semiconductor integrated circuit of the first embodiment.

FIG. 22(B) shows the structure of the n-channel IGFET Qn after the silicide electrode 8G is prepared. The gate electrode 4N includes the first region 4g made of SiGe and second region 4t which is composed of a three-element compound (poly-element compound), $CoSi_zGe_z$, and is formed on the first region 4g. The silicide electrode 8G is laid on the second region 4t of the gate electrode 4N. Prior to silicidation, the second region 4t is made of Si similarly to the second region 4n of the n-channel IGFET Qn in the first embodiment, but is changed to $CoSi_zGe_z$ because of combination of SiGe of the lower first region 4g of SiGe with the upper Co layer during silicidation. The three-element compound composed of $CoSi_zGe_z$ is chemically very stable. The silicide electrode 8G substantially free from Ge can have low resistivity similarly to the silicide electrode 8G of the semiconductor integrated circuit in the first embodiment.

Referring to FIG. 22(C), an n-channel IGFET Qn includes a gate electrode 4N in which a number of first regions 4g of SiGe and a number of second regions 4n of Si are alternately laid over one after another. In the gate electrode 4N, it is basic required that the first region 4g is positioned on the gate insulated film 3 (at the bottom) and that the second region 4n is positioned above the gate insulated film 3 (at the top), i.e. at the position subject to silicidation. A silicide electrode 8G is made through silicidation of a part of the topmost second region 4n, is substantially free from Ge, and can have low resistivity.

FIG. 22(D) shows an n-channel IGFET Qn which is produced through combination of the n-channel IGFET Qn shown in FIG. 22(A) and the n-channel IGFET Qn shown in FIG. 22(C). Specifically, a gate electrode 4N of the n-channel IGFET Qn includes a plurality of first regions 4g of SiGe and a second regions 4n of Si which are alternately laid over one after another. A silicide electrode 8G is formed on the top first region 4g. Prior to silicidation, the top second region 4n of the gate electrode 4N is made of Si, and the silicide electrode 8G is made by completely consuming the top second region 4n during silicidation. The silicide electrode 8G is substantially free from Ge, and can have low resistivity.

FIG. 22(E) shows an n-channel IGFET Qn which is produced through combination of the n-channel IGFET Qn shown in FIG. 22(B) and the n-channel IGFET Qn shown in FIG. 22(C). Specifically, a gate electrode 4N of the n-channel IGFET Qn includes a first region 4g of SiGe, a second region 4n of Si, a first region 4g of SiGe, and a second region 4t of a three-element compound $CoSi_zGe_z$, which are laid over one after another. A silicide electrode 8G is formed on the top second region 4t. The silicide electrode 8G is substantially free from Ge, and can have low resistivity.

P-channel IGFETs Qp are configured similarly to the n-channel IGFETs Qn shown in FIGS. 22(A) to 22(E). C (carbon) is usable in place of Ge as the first IV group element in the p-channel IGFETs Qp.

The semiconductor integrated circuit of the third embodiment is as effective as the semiconductor integrated circuit in the first embodiment.

Fourth Embodiment

In a fourth embodiment, the present invention is applied to a semiconductor integrated circuit including an IGFET with an elevated electrode.

<Device Structure>

Figure 23:
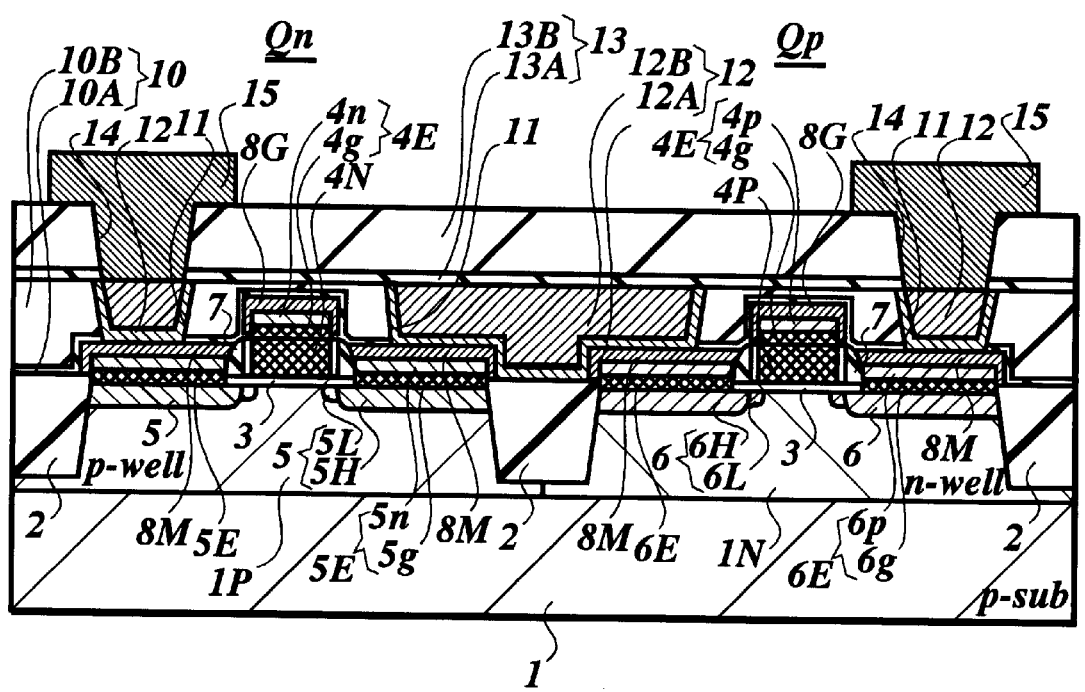
FIG. 23 is a sectional view of a complementary IGFET of a semiconductor integrated circuit according to a fourth embodiment of the invention.

FIG. 23 is a sectional view showing a complementary IGFET in the semiconductor integrated circuit of the fourth embodiment. Similarly to the semiconductor integrated circuit of the first embodiment, this semiconductor integrated circuit mainly comprises a p-type semiconductor substrate 1 composed of single crystal Si having a low impurity concentration, and is provided with the complementary IGFET for constituting a logic circuit, a memory circuit and so on.

The complementary IGFET of this embodiment is basically identical to that of the first embodiment. An n-channel IGFET Qn of the complementary IGFET is formed on a main surface of a p-well region 1P in an area surrounded by an element isolation region 2. The n-channel IGFET Qn is provided with the p-well region 1P used as a channel region, a gate insulated film 3, a gate electrode 4N and a pair of main electrodes 5 functioning as source electrode and a drain electrode.

The p-well region 1P is formed on the main surface of the semiconductor substrate 1, and has a low impurity concentration. The element isolation region 2 is formed by the STI process which is optimum for minimization.

The gate insulated film 3 of the n-channel IGFET Qn is made of 5 nm-thick $SiO_2$ film. The gate electrode 4N corresponds to the first region 4g of the gate electrode 4N in the semiconductor integrated circuit of the first embodiment, and is composed of the two IV group elements which are different from each other. In this embodiment, the gate electrode 4N is made of $Si_{1-x}Ge_x$ containing Si and Ge in the IV group elements. Since the dual gate structure is adopted for the complementary IGFET, the gate electrode 4N of the n-channel IGFET Qn is doped by an n-type impurity, i.e. As is practically usable.

The n-channel IGFET Qn has the extended source-drain structure. Each of the main electrodes 5 includes an n-type semiconductor region 5H having a high impurity concentration, and an n-type semiconductor region 5L having a low impurity concentration and formed between the semiconductor region 5H and the channel forming region. The semiconductor region 5L is self-aligned with respect to the gate electrode 4N. The semiconductor region 5H is self-aligned with respect to the gate electrode 4N and a gate side wall 7 on the gate electrode 4N.

In this n-channel IGFET Qn, an elevated electrode (elevated gate electrode) 4E is electrically connected to the gate electrode 4N, and a silicide electrode 8G is electrically connected to the elevated electrode 4E. In order to accomplish shallowing and low resistivity, an elevated electrode (elevated source or drain electrode) 5E is electrically connected to the main electrodes 5, and a silicide electrode 8M is electrically connected to the elevated electrode 5E.

The elevated gate electrode 4E on the gate electrode 4N has the same structure as that of the gate electrode 4N in the semiconductor integrated circuit of the first embodiment. The elevated electrode 4E is constituted by a lower first region 4g in contact with the gate electrode 4N, and an upper second region 4n formed on the first region 4n. Both of the first and second regions 4g and 4n are made of epitaxial growth layers. The first region 4g is composed of two IV group elements which are different from each other. Specifically, the first region 4g is made of $Si_{1-x}Ge_x$ containing Si and Ge, while the second region 4n is made of Si. Since the dual gate electrode structure is adopted, the elevated electrode 4E is doped by the n-type impurity As.

The silicide electrode 8G is formed on the second region 4n of the elevated electrode 4E, i.e. it is positioned on the upper and side surfaces of the second region 4n. In detail, the silicide electrode 8G is produced through silicidation of the second region 4n of the elevated electrode 4E, using the same manufacturing process for making the silicide electrode 8M on the main electrodes 5 through salicidation. In this embodiment, the silicide electrode 8G is practically made of a $CoSi_y$ film. Alternatively, a $TiSi_y$ film is also usable for the silicide electrode 8G.

An elevated electrode 5E on the main electrodes 5 includes a lower first region 5g in contact with the main electrodes 5, and an upper second region 5n provided on the first region 5g, similarly to the elevated electrode 4E. Both of the first and second regions 5g and 5n are made of epitaxial growth layers. Specifically, the first region 5g is composed of $Si_{1-x}Ge_x$ while the second region 5n is composed of Si. The elevated electrode 5E is doped by the n-type impurity As.

The silicide electrode 8M is present on the elevated electrode 5E similarly to the silicide electrode 8G, and is produced through silicidation (salicidation) of at least a part of the second region 5n of the elevated electrode 5E. Further, the silicide electrode 8M is basically produced on the same conductive layer using the same manufacturing process as that for the silicide electrode 8G, and is made of a $CoSi_y$ film similarly to the silicide electrode 8G.

In the complementary IGFET, the p-channel IGFET Qp is formed on the main surface of the n-type well region 1N at an area surrounded by an element isolation region 2, as shown in FIG. 23, and includes an n-type well region 1N, gate insulated film 3, gate electrode 4P, and a pair of main electrodes 6 functioning as a source electrode and a drain electrode.

The gate insulated film 3 of the p-channel IGFET Qp is formed on the same insulated layer as that for the gate insulated film 3 of the n-channel IGFET Qn and in the same manufacturing process. The gate insulated film 3 is made of a $SiO_2$ film, for example.

The gate electrode 4P is composed of $Si_{1-x}Ge_x$ similarly to the gate electrode 4N. Because of the dual gate structure of the complementary IGFET, the gate electrode 4P of the p-channel IGFET Qp is practically doped by the p-type impurity $BF_2$.

Since the p-channel IGFET Qp adopts the extended source-drain structure, each main electrode 6 is constituted by a p-type semiconductor region 6H having a high impurity concentration, and a p-type semiconductor region 6L having a low impurity concentration. The semiconductor region 6L is self-aligned with respect to the gate electrode 4P, while the semiconductor region 6H is self-aligned with respect to the gate electrode 4P and a gate side wall 7 on the side wall of the gate electrode 4P.

In this p-channel IGFET Qp, the elevated electrode (elevated gate electrode) 4E is electrically connected to the gate electrode 4P, and the silicide electrode 8G is electrically connected to the elevated electrode 4E. In order to accomplish shallowing and low resistivity, the elevated electrode (elevated source or drain electrode) 6E is electrically connected to the main electrodes 6, and the silicide electrode 8M is electrically connected to the elevated electrode 6E.

The elevated gate electrode 4E on the gate electrode 4P has the same structure as that of the elevated electrode 4E on the gate electrode 4N. The elevated electrode 4E is constituted by a lower first region 4g in contact with the gate electrode 4P, and an upper second region 4p formed on the first region 4n. Both of the first and second regions 4g and 4p are made of epitaxial growth layers. The first region 4g is composed of two IV group elements which are different from each other, i.e. it is of an $Si_{1-x}Ge_x$ film. The second region 4p is made of an Si film. Since the dual gate electrodes structure is adopted, the elevated electrode 4E is doped by the p-type impurity $BF_2$.

The silicide electrode 8G is formed on the second region 4p of the elevated electrode 4E, i.e. it is positioned on the upper and side surfaces of the second region 4p. In detail, the silicide electrode 8G is produced through silicidation (salicidation) of at least a part of the second region 4p of the elevated electrode 4E, using the same manufacturing process for making the silicide electrode 8G of the n-channel IGFET Qn. In this embodiment, the silicide electrode 8G is actually made of a $CoSi_y$ film.

An elevated electrode 6E on the main electrodes 6 includes a lower first region 6g in contact with the main electrodes 6, and an upper second region 5n provided on the first region 6g, similarly to the elevated electrode 5E. Both of the first and second regions 6g and 6p are made of epitaxial growth layers. Specifically, similarly to the first region 5g of the elevated electrode 5E, the first region 6g is composed of $Si_{1-x}Ge_x$ while the second region 6p is composed of Si. The elevated electrode 6E is doped by the p-type impurity $BF_2$.

A silicide electrode 8M is present on the elevated electrode 6E similarly to the silicide electrode 8G, and is produced through silicidation (salicidation) of at least a part of the second region 6p of the elevated electrode 6E. Further, the silicide electrode 8M is positioned on the same conductive layer using the same manufacturing process as that for the silicide electrode 8G, and is made of a $CoSi_y$ film similarly to the silicide electrode 8G.

Figure 24:
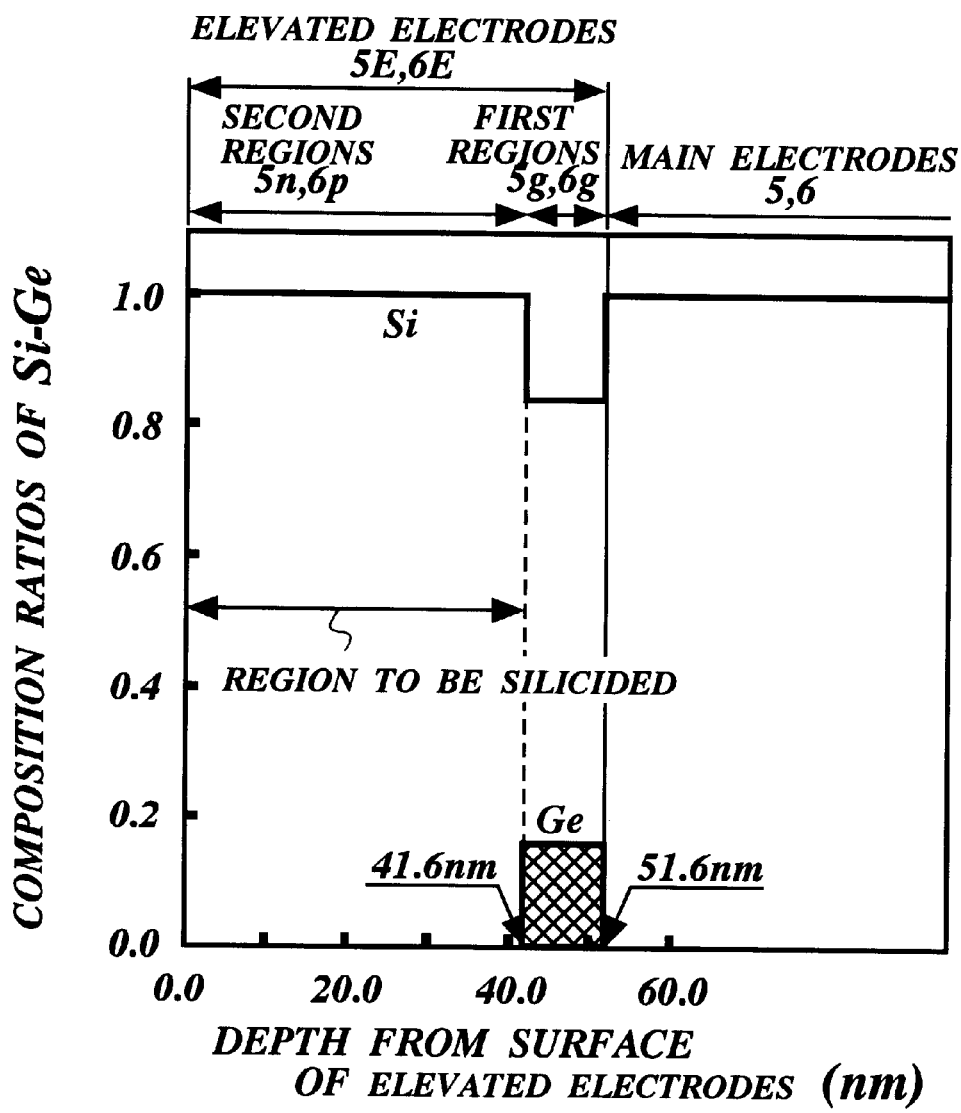
FIG. 24 is a graph showing the relationship between a depth from an elevated electrode surface and a composition ratio of SiGe in the fourth embodiment of the invention.
Figure 25:
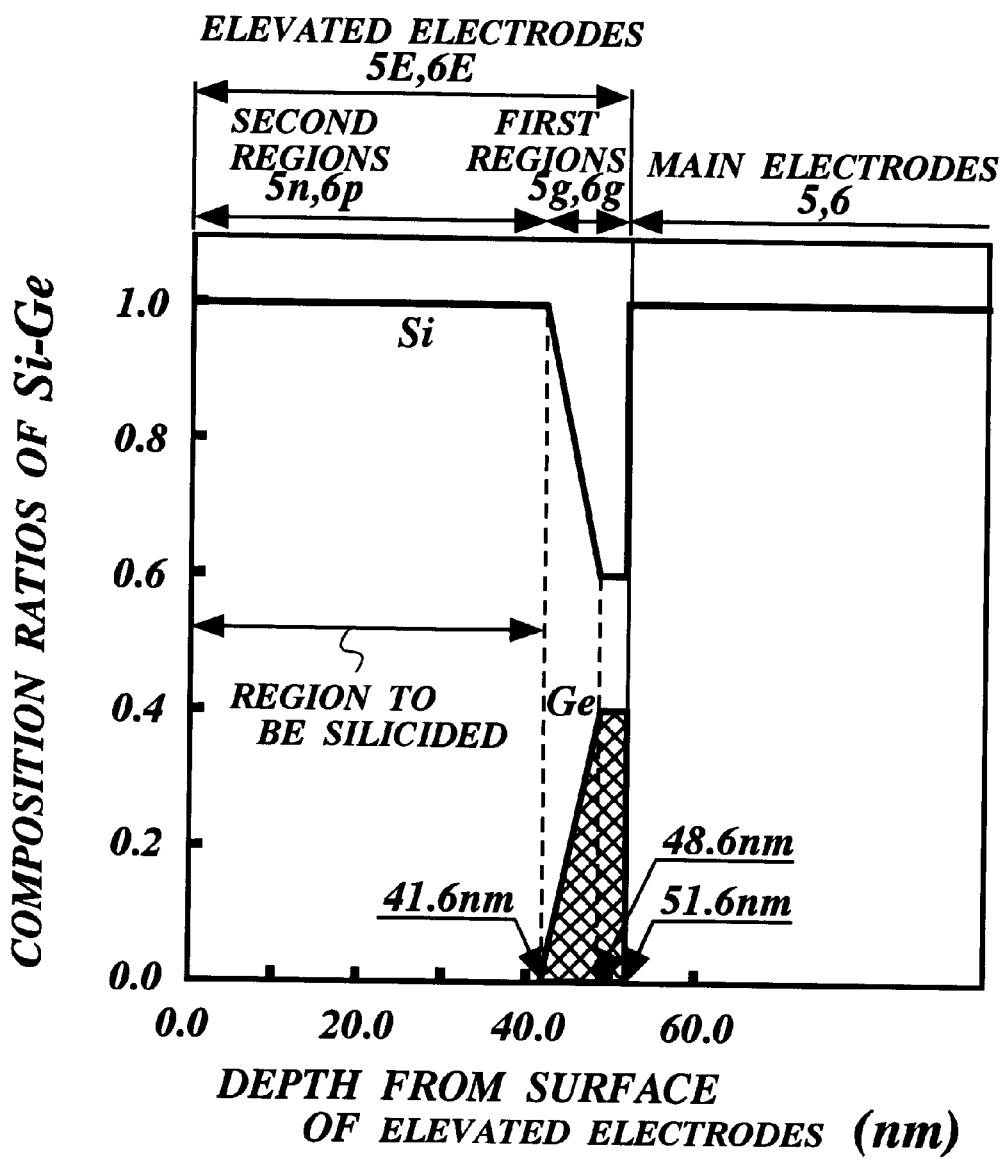
FIG. 25 is a further sectional view showing the relationship between a depth from an elevated electrode surface and a composition ratio of SiGe in a fourth embodiment of the invention.

FIGS. 24 and 25 show the relationship between depths of the elevated electrodes 5E and 6E from their surfaces (before salicidation) and a composition ratio of SiGe. The elevated electrodes 5E and 6E in FIG. 24 are made of 51.6 nm-thick films. The first and second regions 5g and 6g are made of 10 nm-thick $Si_{0.86}Ge_{0.16}$ films, and have the composition ratio of Si being 0.84, and the composition ratio of Ge being 0.16. The composition ratio of Ge is preferably 0.1 or larger. The second regions 5n and 6p should be 41.6 nm thick in order to produce the silicide electrode 8M which is a 40 nm-thick $CoSi_y$ film. The thickness of the first and second regions 5n and 6p is determined assuming that all of Si therein is consumed for producing the silicide electrode 8M. However, if some of Si should be left, these regions 5n and 6p should be 41.6 nm thick or more.

The elevated electrode 5E shown in FIG. 25 has the composition ratio of Ge in the first region 5g which gradually reduces in accordance with the distance from the main electrodes 5, as in the gate electrode 4N in the second embodiment. Further, the elevated electrode 6E shown in FIG. 25 has the composition ratio of Ge in the first region 6g which gradually reduces in accordance with the distance from the main electrodes 6, as in the gate electrode 4P in the second embodiment. In other words, the composition ratio of Ge in the first region 5g is set to 0.4 to the distance of 3 nm from the main electrodes 5, and thereafter it is gradually reduced depending upon the distance from the main electrodes 5. As the composition ratio of Ge is reduced, the composition ratio of Si in the first region 5g is increased. The same holds true to the composition ratios of Ge and Si in the first region 6g of the gate electrodes 6E.

The elevated electrodes 4E are respectively formed on the gate electrodes 4N and 4P of the n-channel IGFET Qn and the p-channel IGFET Qp using the process for producing the elevated electrodes 5E and 6E. In other words, the elevated electrodes 4E have the structure substantially identical to the structure of the elevated electrodes 5E and 6E.

Generaly, the elevated electrode 5E is made shallow by reducing the junction depth of the main electrodes 5, and the elevated electrode 6E is also made shallow by reducing the junction depth of the main electrodes 6. As shown in FIG. 24 or 25, the first region 6g, which is positioned near the main electrodes 6 of the elevated electrode 6E of the p-channel IGFET Qp and is composed of $Si_{0.86}Ge_{0.16}$, is effective in reducing the diffusion speed of the p-type impurity, e.g. B, doped into the elevated electrode 6E in order to obtain the semiconductor region 6H that is provided in the main electrodes 6 and has a high impurity concentration. This further promotes shallowing of the main electrodes 6. The diffusion coefficient of B in the first region 6g, i.e. in $Si_{0.86}Ge_{0.16}$, is 0.5 to 0.1 times smaller than the diffusion coefficient of B in Si at 1000° C., as described with respect to the semiconductor integrated circuit of the first embodiment.

The active concentration of B in SiGe is large compared with that in Si, so that the hole concentration in the elevated electrode 6E is larger than that in Si. This is effective in further reducing diffusion layer resistance in the p-type semiconductor region 6H of the main electrodes 6.

Since the second region 5n of the elevated electrode 5E and the second region 6p of the elevated electrodes 6E are made of Si, the silicide electrodes 8M prepared by silicidation (salicidation) are substantially free from Ge, and can have low resistivity as described with respect to the first embodiment.

SiGe has an energy gap larger than that of Si because a level of conduction band of SiGe is higher than that a level of conduction band of Si. In this embodiment, when the first region 5g of the elevated electrode 5E and the first region 6g of the elevated electrode 6E are made of $Si_{0.86}Ge_{0.16}$, and when Si in the second regions 5n and 6p is completely consumed for forming the silicide electrode 8M, Schottky junction is caused between $SiO_{0.86}Ge_{0.16}$ in the first regions 5g and 6g, and between the silicide electrode 8M. A barrier height of this Schottky junction is smaller by 0.1 keV to 0.5 keV than that of Si and $CoSi_2$. As a result, reduction in contact resistances can be accomplished between the elevated electrode 5E and the silicide electrode 8M, and between the elevated electrode 6E and the silicide electrode 8M.

The elevated electrodes 4E are provided in both the gate electrodes 4N and 4P of the n-channel IGFET Qn and p-channel IGFET Qp, and have the structure substantially identical to the structure of the gate electrodes 4N and 4P of the n-channel and p-channel IGFET Qn and IGFET Qp in the first embodiment, so that this embodiment is as effective as the first embodiment. In other words, it is possible to prevent the gate electrode 4N from changing into a depletion layer in the n-channel IGFET Qn, and stabilize the threshold voltage. Especially, in the n-channel IGFET Qn having the dual gate structure, the elevated electrode 4E is formed on the gate electrode 4N, and the n-type impurity for accomplishing the dual gate structure tends to have a longer effective diffusion length. In this embodiment, since the gate electrode 4N is composed of SiGe, the n-type impurity can be sufficiently diffused into the gate electrode 4N and the vicinity of the gate insulated film 3. In the p-channel IGFET Qp, it is possible to prevent the leakage of the p-type impurity to the channel forming region from the gate electrode 4P, and stabilize the threshold voltage.

Referring to FIG. 23, a wiring 15 is electrically connected to the main electrodes 5 of the n-channel IGFET Qn via the silicide electrode 8M and a contact plug electrode 12. Further, the wiring 15 is electrically connected to the main electrodes 6 of the p-channel IGFET Qp via the silicide electrode 8M and contact plug electrode 12.

Although not shown in FIG. 23, the wiring 15 is electrically connected to the main electrodes 5 of the n-channel IGFET Qn via the silicide electrode 8M and contact plug electrode 12. Further, the wiring 15 is electrically connected to the main electrodes 6 of the p-channel IGFET Qp via the silicide electrode 8M and contact plug electrode 12.

<Manufacturing Process>

The semiconductor integrated circuit including the IGFET will be manufactured by the processes shown in FIGS. 26 to 32.

(1) First of all, there is prepared a p-type semiconductor substrate 1 made of single crystal Si and having a low impurity concentration. A p-well region 1P is formed at an area for an p-channel IGFET Qp on the main surface of the semiconductor substrate 1, and an n-well region 1N is formed at an area for an n-channel IGFET Qn on the main surface of the semiconductor substrate 1 (see FIG. 26).

Figure 26:
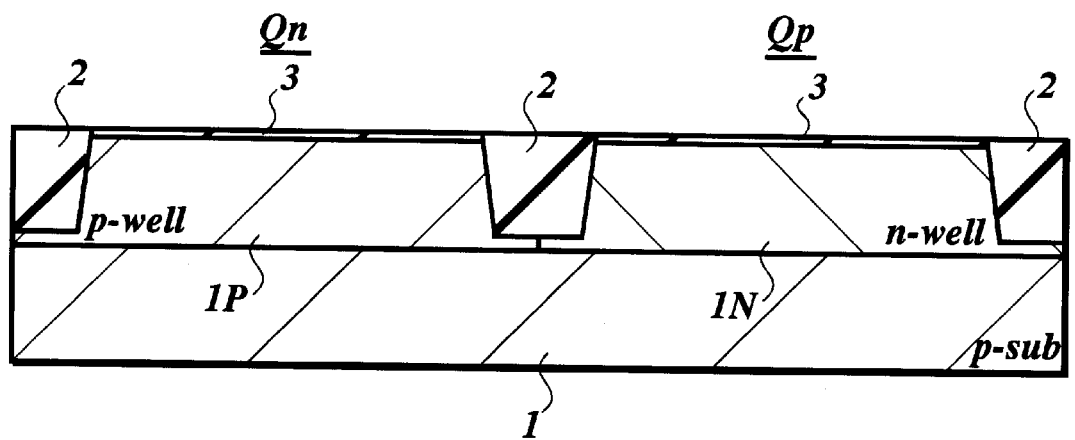
FIG. 26 to FIG. 32 are sectional views showing steps for manufacturing a semiconductor integrated circuit in the fourth embodiment.

(2) An element isolation region 2 is formed between element forming regions including IGFETs as in the process for manufacturing the semiconductor integrated circuit in the first embodiment (see FIG. 26).

(3) As shown in FIG. 26, a gate insulated film 3 is prepared on the main surface of the semiconductor substrate 1 in the areas for the n-channel IGFET Qn and p-channel IGFET Qp. In this embodiment, the gate insulated film 3 is constituted by an $SiO_2$ film prepared by thermal oxidation in which the semiconductor substrate 1 is heated in an oxidation atmosphere. The gate insulated film 3 has a thickness determined in accordance with a required threshold voltage, and is 2.5 nm thick in this embodiment. It is preferable that a dopant is applied to the channel forming region prior to the formation of the gate insulated film 3, in order to control the threshold voltage.

Figure 27:
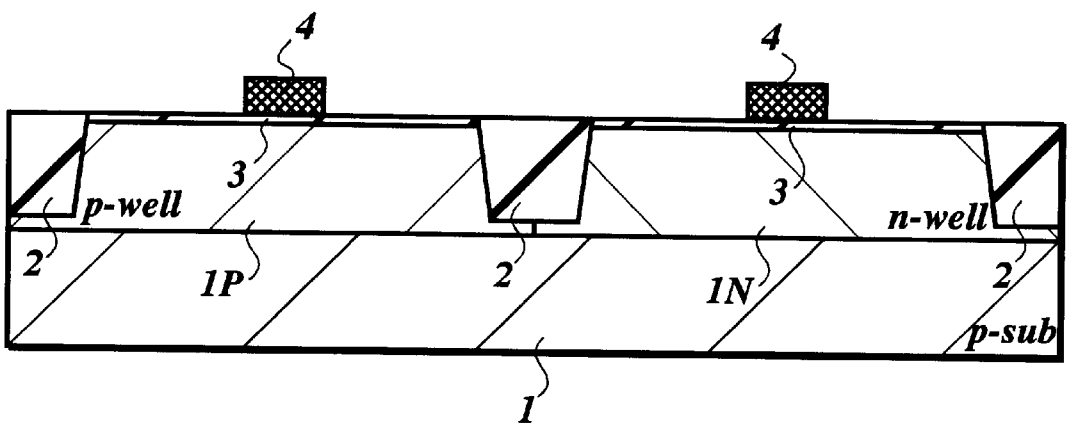

(4) Referring to FIG. 27, a gate electrode 4 is provided on the gate insulated film 3 at areas for making the n-channel IGFET Qn and p-channel IGFET Qp. The gate electrode 4 is produced by the CVD process in which a mixture of an $Si_2H_6$ gas and a $GeH_4$ gas is used as a source gas. With the CVD process, partial pressure and film forming temperature of the $Si_2H_6$ and $GeH_4$ gases are appropriately controlled, and a composition ratio of Ge in the gate electrode 4 is varied in accordance with a distance from the gate insulated film 3, thereby obtaining the gate electrode 4. The gate electrode 4 is 0.15 $\mu$m thick, for example, and totally composed of $Si_{1-x}Ge_x$ since the elevated electrode 4E is present thereon. Similarly to the first regions 4g of the gate electrodes 4N and 4P in the first embodiment, the gate electrode 4 is formed under the following conditions: a flow rate of $Si_2H_6$ gas being 5 sccm; a flow rate of $GeH_4$ gas being 1 sccm; a film forming pressure being $1.3 \times 10^2$ Pa; a film forming temperature being 500° C.; and a film forming period being 38 minutes. Therefore, the gate electrode 4 is made of an $Si_{0.86}Ge_{0.16}$ film having the composition ratio of Ge being 0.16, and the composition ratio of Si being 0.84. The gate electrode 4 is then patterned by the anisotropic etching such as the RIE, using a mask prepared by the photolithograpy process. In this state, the gate electrode 4 is not doped by any of the n-type and p-type impurities.

Alternatively, the gate electrode 4 may be formed by the CVD process in which a mixture of $SiH_4$ gas and $Ge_2H_6$ gas is used as the source gas, as described with respect to the process for making the semiconductor integrated circuit in the first embodiment. Further, the gate electrode 4 may be formed by the MBE. Still further, the gate electrode 4 is structured similarly to the gate electrodes 4N and 4P in the semiconductor integrated circuit in the first embodiment, i.e. may include the first region 4g made of SiGe and a second region made of Si.

Figure 28:
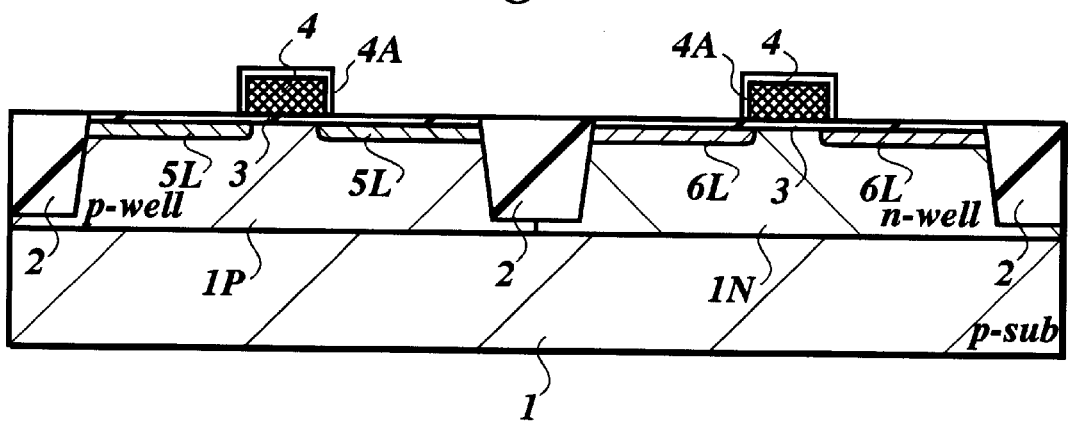

After the formation of the gate electrode 4, an insulating film 4A for covering the gate electrode 4 is then formed, and is practically constituted by a $SiO_2$ film prepared by the thermal oxidation (see FIG. 28).

(5) Next, an extended source/drain process will be started. First of all, as shown in FIG. 28, an n-type semiconductor region 5L having a low impurity concentration is formed on the n-channel IGFET Qn forming area in order to make a pair of main electrodes 5 which are used as a source electrode and a drain electrode. Thereafter, a p-type semiconductor region 6L having a low impurity concentration is formed on the p-channel IGFET Qp forming area in order to make a pair of main electrodes 6 which are used as a source electrode and a drain electrode.

The semiconductor region 5L is formed by doping the n-type impurity into the main surface of the p-well region 1P, with the gate electrode 4, element isolation region 2, and a mask (shown in FIG. 11) covering the p-channel IGFET Qp used as an anti-impurity implantation mask. The n-type impurity is As which has a low diffusion speed and is suitable for shallowing. Generally speaking, an amount of implantation energy for ion-implanting As is 10 keV to 50 keV, and dose is $10^{14}$ atoms/cm$^2$–$10^{15}$ atoms/cm$^2$. In this embodiment, the implantation energy and dose of As are 15 keV, and $10^{14}$ atoms/cm$^2$, respectively.

The semiconductor region 6L is formed by doping the n-type impurity into the main surface of the p-well region 1P, with the gate electrode 4, element isolation region 2, and a mask (shown in FIG. 12) covering the n-channel IGFET Qn used as an anti-impurity implantation mask. The p-type impurity is $BF_2$ which accomplishes a shallow ion implantation distribution and is suitable for shallowing. In this embodiment, the implantation energy and dose of $BF_2$ are 10 keV, and $10^{14}$ atoms/cm$^2$, respectively. B or B molecular ions are practically usable as the p-type impurity.

After ion-implanting As and $BF_2$, the semiconductor substrate 1 is preferably annealed in order to recover a damaged surface thereof and activate the impurity.

Figure 29:
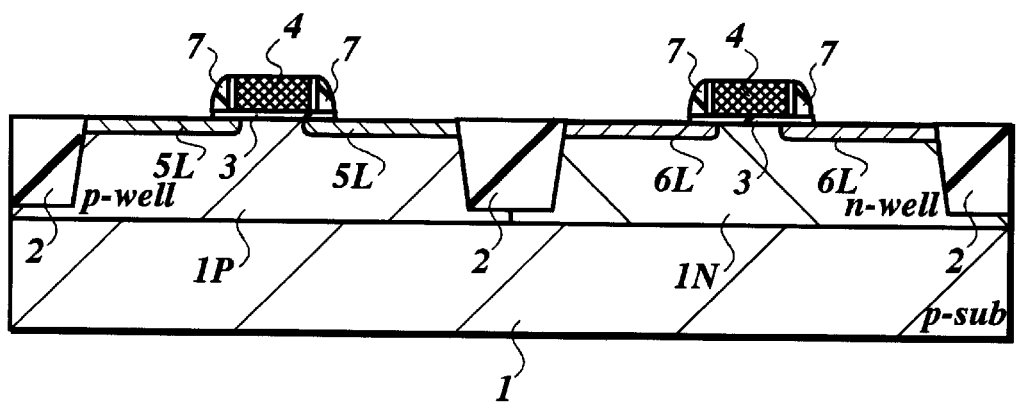

(6) As shown in FIG. 29, a gate side wall 7 is formed, via the insulating film 4A, on a side wall of the gate electrode 4 at areas for the n-channel IGFET Qn and p-channel IGFET Qp. In this embodiment, the gate side wall 7 is made of a $Si_3N_4$ film.

Figure 30:
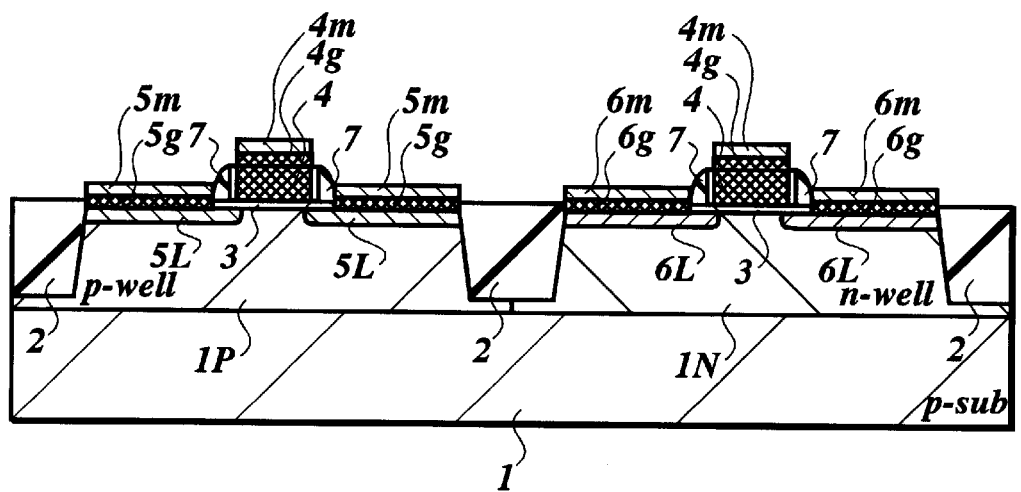

(7) Referring to FIG. 30, in order to form an elevated electrode, a first region 5g and a second region 5m are laid over one after another on the semiconductor region 5L at the n-channel IGFET Qn forming area. A first region 4g and a second region 4m are laid over one after another on the gate electrode 4. Further, a first region 6g and a second region 6m are laid over one after another on the semiconductor region 6L at the p-channel IGFET Qp forming area, and a first region 4g and a second region 4m are laid over one after another on the gate electrode 4. The first regions 4g, 5g and 6g, and the second regions 4m, 5m and 6m are epitaxial growth layers prepared by the MBE process in this embodiment. A mixture of an $Si_2H_6$ gas and a $GeH_4$ gas is used as a source gas, thereby producing the first regions 4g, 5g and 6g which are composed of $Si_{0.86}Ge_{0.16}$ and are 10 nm thick, as shown in FIG. 24. The composition ratio of Ge in the first regions 4g, 5g and 6g is optionally varied in accordance with the distance from surface of the base layer by controlling the partial pressure and growth temperature of the $Si_2H_6$ and $GeH_4$ gases, as shown in FIG. 25. The second regions 4m, 5m and 6m are formed after the first regions 4g, 5g and 6g, and are made of Si films which are 41.6 nm thick or more. Thereafter, the second regions 4m, 5m and 6m are formed through eptaxial growth by the $Si_2H_6$ gas as the source gas.

In this embodiment, the elevated electrode is made of single crystal SiGe and Si films which are epitaxially grown. Alternatively, a poly crystal film or amorphous film may be used for making the elevated electrode. Further, the elevated electrode may be made of an SiC film containing two different IV group elements or an SiGeC film containing three different IV group elements, or an SiGeC film made of three different IV group elements.

Figure 31:
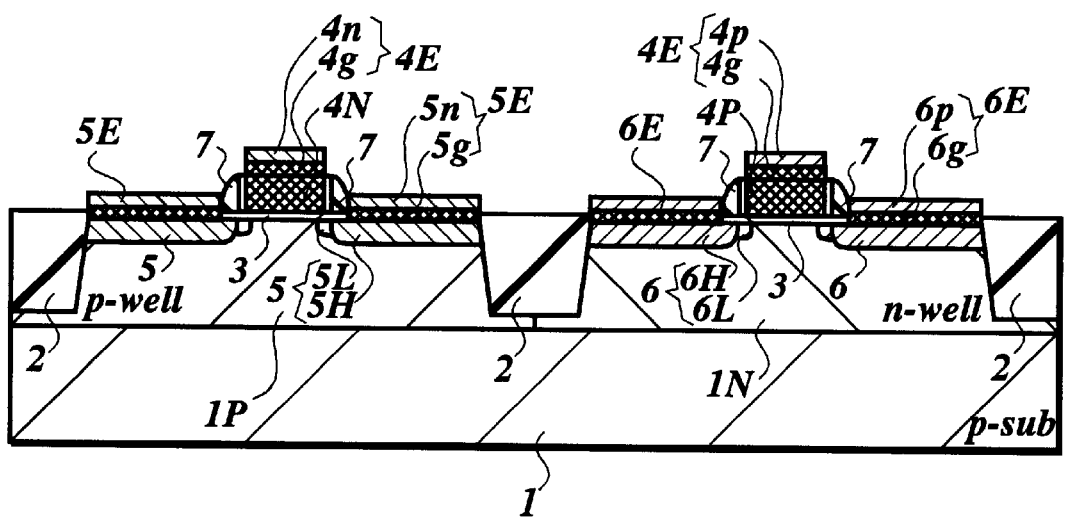

(8) In order to produce a pair of the main electrodes 5, the n-type semiconductor region 5H having a high impurity concentration is formed at the n-channel IGFET Qn forming area, and a pair of the main electrodes 6, and the p-type semiconductor region 6H having a high impurity concentration is formed at the p-channel IGFET Qp forming area, as shown in FIG. 31.

The n-type semiconductor region 5H is formed as follows. The n-type impurity is doped by ion implantation into the first region 5g and the second region 5m which constitute the elevated electrode 5E at the n-channel IGFET Qn forming area and have a peak therein. Then, the doped n-type impurity is diffused onto the surface of the p-well region 1P. The doped n-type impurity is diffused onto the surface of the p-well region 1P. In this embodiment, since the complementary IGFET adopts the dual gate electrode structure, the n-type impurity is also doped into the first region 4g and the second region 4m which constitute the elevated electrode 4E on the gate electrode 4. The doped n-type impurity is diffused onto the gate electrode 4, thereby producing the n-type gate electrode 4N. Further, the n-type impurity doped into the first and second regions 4g and 4m is activated, thereby obtaining the elevated electrode 4E. Still further, the n-type impurity doped into the first and second regions 5g and 5m is activated, thereby obtaining the elevated electrode 5E. As is used as the n-type impurity since it has a low diffusion speed and is suitable for shallowing. In this embodiment, implantation energy and dose of As are 50 keV and $3 \times 10^{15}$ atoms/cm$^2$, respectively.

The p-type semiconductor region 6H is formed as follows. The p-type impurity is doped by ion implantation into the first region 6g and the second region 6m which constitute the elevated electrode 6E at the p-channel IGFET Qp forming area. Then, the doped p-type impurity is diffused onto the surface of the n-well region 1N. In this embodiment, since the dual gate electrode structure is adopted, the p-type impurity is also doped into the first region 4g and the second region 4m which constitute the elevated electrode 4E on the gate electrode 4. The doped p-type impurity is diffused onto the gate electrode 4, thereby producing the p-type gate electrode 4P. Further, the p-type impurity doped into the first and second regions 4g and 4m is activated, thereby obtaining the elevated electrode 4E. Still further, the p-type impurity doped into the first and second regions 6g and 6m is activated, thereby obtaining the elevated electrode 6E. $BF_2$ is used as the p-type impurity since it has a low diffusion speed and is suitable for shallowing. In this embodiment, implantation energy and dose of $BF_2$ are 40 keV and $3 \times 10^{15}$ atoms/cm$^2$, respectively.

The n-type and p-type impurities are diffused and activated by the annealing process such as RTA in an $N_2$ gas, at 1000° C. and for 10 seconds.

When the process shown in FIG. 31 is finished, the main electrodes 5 constituted by the semiconductor regions 5L and 5H are formed, thereby substantially completing the n-channel IGFET Qn. In the channel forming region of the n-channel IGFET Qn of this embodiment, the acceptor concentration is approximately $10^{17}$ atoms/cm$^3$–$10^{18}$ atoms/cm$^3$, the donor concentration of the main electrodes 5 is approximately $10^{19}$ atoms/cm$^3$–$10^{21}$ atoms/cm$^3$, and a junction depth of the main electrodes 5 is approximately 50 nm–200 nm. Having the dual gate structure, the gate electrode 4N of the n-channel IGFET Qn is set to the n-type, is of a surface channel type, and is suitable for suppressing short channel effects, promoting the high speed operation, and minimization. The main electrodes 6 including the semiconductor regions 6L and 6H are also formed, thereby substantially completing the p-channel IGFET Qp. In the channel forming region of the p-channel IGFET Qp, the donor concentration is approximately $10^{17}$ atoms/cm$^3$–$10^{18}$ atoms/cm$^3$, the acceptor concentration of the main electrodes 6 is approximately $10^{19}$ atoms/cm$^3$–$10^{21}$ atoms/cm$^3$, and a junction depth of the main electrodes 6 is approximately 50 nm–200 nm. Having the dual gate structure, the gate electrode 4P of the P-channel IGFET Qp is set to the p-type, is of a surface channel type, and is suitable for suppressing short channel effects, promoting the high speed operation, and minimization.

When ion-implanting the n-type and p-type impurities, $SiO_2$ films are preferably used as buffer films for protecting the surfaces of the elevated electrodes 4E, 5E and 6E against damages and contamination.

Figure 32:
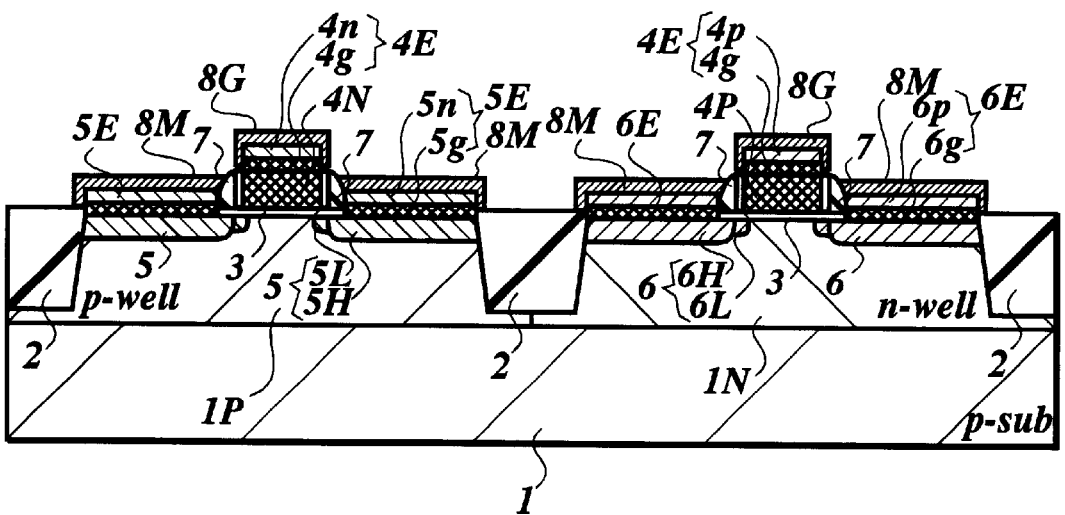

(9) As shown in FIG. 32, in the n-channel IGFET Qn, the silicide electrode 8G and 8M are formed on the elevated electrodes 4E and 5E, respectively. Further, in the p-channel IGFET Qp, the silicide electrodes 8G and 8M are formed on the elevated electrodes 4E and 6E, respectively. These silicide electrodes 8G and 8M are made of $CoSi_y$ films prepared through salicidation in the same manufacturing process. The $CoSi_y$ films are formed as follows. First of all, the surfaces of the elevated electrodes 4E, 5E and 6E are exposed. Thereafter, a Co film is prepared all over the semiconductor substrate 1, and a TiN film is formed thereon as a cap layer. Both the Co and TiN films are formed by sputtering. The Co film is 11.5nm thick, for example. The Co film undergoes two annealing steps, i.e. it is first annealed in non-oxide atmosphere at 500° C. for 60 seconds in order remove the TiN film and non-reactive Co film, and is then annealed at 750° C. for 30 seconds. Thus, the silicide electrodes 8G and 8M having the thickness of 40 nm will be prepared. The annealing steps are executed by the RTA process, in which a mixture of sulfuric acid and hydrogen peroxide is actually used to remove the non-reactive Co film, as described with respect to the first embodiment.

In the n-channel IGFET Qn, the silicide electrode 8G is prepared through silicidation of a part of the second region 4n of the elevated electrode 4E which is composed of Si and is free from Ge. Therefore, the silicide electrode 8G is free from Ge. Further, the silicide electrode 8M is prepared through silicidation of a part of the second region 5n of the elevated electrode 4E which is composed of Si and is free from Ge. The silicide electrode 8M does not contain Ge. In the p-channel IGFET Qp, the silicide electrode 8G is prepared through silicidation of a part of the second region 4p of the elevated electrode 4E which is composed of Si and is free from Ge. The silicide electrode 8M is free from Ge. Further, the silicide electrode 8M is formed through silicidation of at least a part of the second region 6p composed of Si, and does not contain Ge.

FIG. 32 (also FIG. 23) shows that the second regions 4n, 4p, 5n and 6p partially remain not-silicided in the elevated electrodes 4E, 5E and 6E. However, in order to reduce contact resistances between the elevated electrode 6E and the silicide electrode 8M, and between the elevated electrode 6E and the silicide electrode 8M, all of the second regions 4n, 4p, 5n and 6p should undergo silicidation, as described with respect to FIGS. 24 and 25.

(10) An insulated inter-layer film 10, connection hole 11, contact plug electrode 12, insulated inter-layer film 13, connection hole 14 and wiring 15 will be sequentially formed, so that the semiconductor integrated circuit of this embodiment, shown in FIG. 23, will be completed.

In the semiconductor integrated circuit of this embodiment, since Ge, i.e. the second IV group element, is contained in the first region 6g of the elevated electrode 6E of the epitaxial growth layer, i.e. the p-channel IGFET Qp, it is possible to reduce the diffusion speed of B as the p-type impurity doped into the elevated electrode 6E. Therefore, it is possible to accomplish shallow junction of the p-type semiconductor region 6H which is formed by diffusion of low concentration impurity from the elevated electrode 6E.

This is effective in producing shallow main electrodes and improving the integration of the semiconductor integrated circuit.

Further, the active concentration of the p-type impurity in the elevated electrode 6E is larger than that in the Si elevated electrode, so that the carrier concentration in the elevated electrode 6E can be raised. The elevated electrode 6E can have low resistivity and reduce power supply voltage, which is effective in accelerating the circuit operation and reducing power consumption of the semiconductor integrated circuit.

The silicide electrodes 8G and 8M are substantially free from Ge as the second IV group element, and can have low resistivity. As a result, it is possible to promote accelerated switching operation and reduce power consumption of the n-channel IGFET Qn and the p-channel IGFET Qp. It is also possible to accelerate the circuit operation of the semiconductor integrated circuit and to reduce power consumption thereof.

When the silicide electrode 8M is produced by completely consuming the second region 5n of the elevated electrode 5E on the main electrodes 5 of the n-channel IGFET Qn, it is possible to reduce an energy gap between the the first region 5g made of SiGe in the elevatated electrode 5E and the silicide electrode 8M. A height of a Schottkey barrier can be also decreased. This is effective in lowering the contact resistance between the elevated electrode 5E and the silicide electrode 8M. When the silicide electrode 8M is produced by completely consuming the second region 6p of the elevated electrode 6E on the main electrodes 6 of the p-channel IGFET Qp, it is possible to reduce an energy gap between the first region 5g made of SiGe in the elevatated electrode 5E and the silicide electrode 8M. A height of a Schottkey barrier can be also decreased. This is effective in lowering the contact resistance between the elevated electrode 6E and the silicide electrode 8M. The semiconductor integrated circuit can accelerate its circuit operation and reduce its power consumption.

Fifth Embodiment

This embodiment relates to a semiconductor integrated circuit including an IGFET in which a modified elevated electrode is provided.

<Device Structure>

Figure 33:
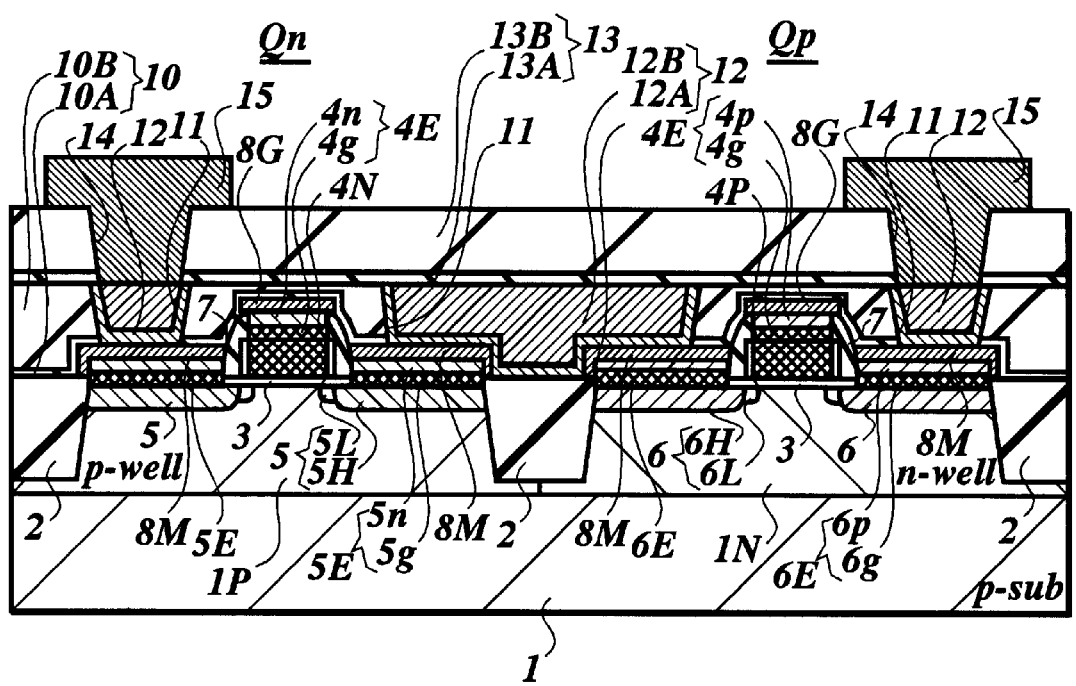
FIG. 33 is a sectional view of a complementary IGFET of a semiconductor integrated circuit according to a fifth embodiment of the invention.

FIG. 33 is a sectional view of a complementary IGFET in the semiconductor circuit in the fifth embodiment. An n-channel IGFET Qn has the structure substantially identical to that of the semiconductor integrated circuit of the fourth embodiment, except that a silicide electrode 8G is formed only on the upper surface of an elevated electrode 4E of a gate electrode 4N. The side surface of the elevated electrode 4E, i.e. the side surface of a first region 4g, is covered by a gate side wall 7. In a p-channel IGFET Qp, a silicide electrode 8G is formed only on the upper surface of an elevated electrode 4E of a gate electrode 4P. The side surface of the elevated electrode 4E, i.e. the side surface of a first region 4g, is covered by a gate side wall 7. In other words, the silicide 8G is formed by consuming only Si in the second region 4n or 4p without silicidation of the first region 4g made of SiGe in the elevated electrode 4E. Therefore, the silicide 8G substantially free from Ge can have low resistivity.

<Manufacturing Process>

The semiconductor integrated circuit including the IGFET will be manufactured by the processes as described hereinafter and shown in FIGS. 34 to 41.

(1) First of all, there is prepared a p-type semiconductor substrate 1 made of single crystal Si and having a low impurity concentration. A p-well region 1P is formed at an area for an n-channel IGFET Qn on the main surface of the semiconductor substrate 1, and an n-well region 1N is formed at an area for an n-channel IGFET Qn on the main surface of the semiconductor substrate 1 (see FIG. 34).

Figure 34:
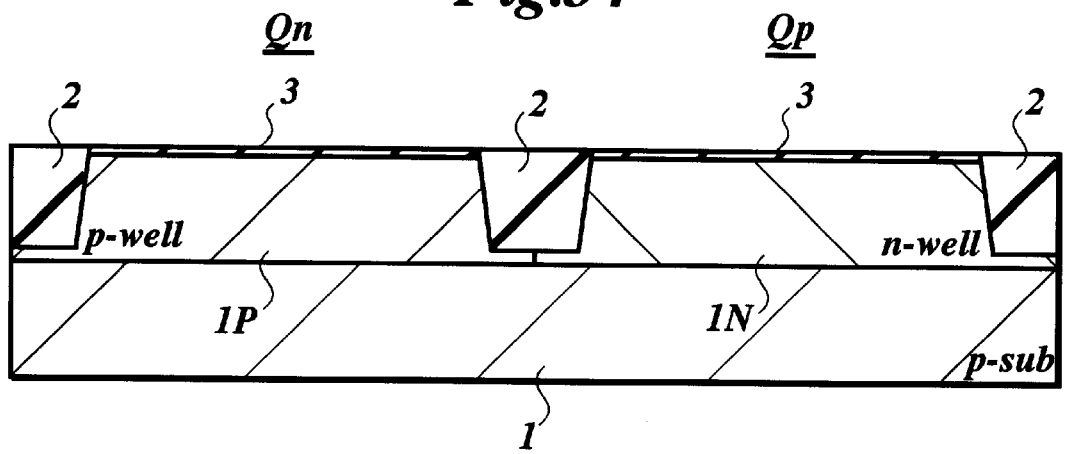

(2) An element isolation region 2 is formed between element forming regions including IGFETs as in the process for manufacturing the semiconductor integrated circuit in the first embodiment (see FIG. 34).

(3) As shown in FIG. 34, a gate insulated film 3 is prepared on the main surface of the semiconductor substrate 1 in the areas for the n-channel IGFET Qn and p-channel IGFET Qp. In this embodiment, the gate insulated film 3 is constituted by an $SiO_2$ film prepared by thermal oxidation in which the semiconductor substrate 1 is heated in an oxidation atmosphere. The gate insulated film 3 has a thickness determined in accordance with a required threshold voltage, and is 5 nm thick in this embodiment. Although not described in detail, it is preferable that a dopant is applied to the channel forming region prior to the formation of the gate insulated film 3, in order to control the threshold voltage.

Figure 35:
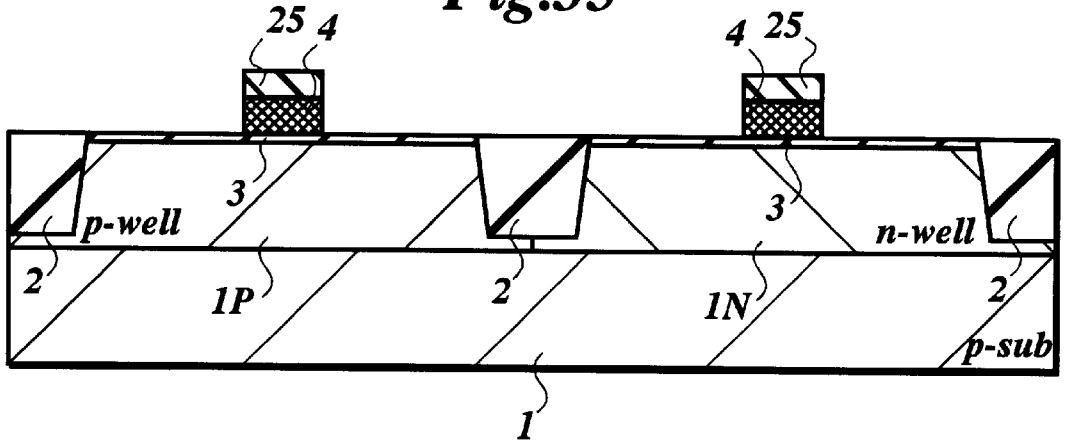

(4) Referring to FIG. 35, a gate electrode 4 is formed on the gate insulated film 3 at channel forming areas of the n-channel IGFET Qn and the p-channel IGFET Qp. A dummy electrode film 25 is prepared on the gate electrode 4.

The gate electrode 4 is produced by the CVD process in which a mixture of $Si_2H_6$ and $GeH_4$ is used as a source gas. With the CVD process, partial pressure and film forming temperature of the $Si_2H_6$ and $GeH_4$ gases are appropriately controlled, and a composition ratio of Ge is varied in accordance with a distance from the gate insulated film 3. The gate electrode 4 is 0.15 $\mu$m thick, for example, and composed of $Si_{1-x}Ge_x$, because an elevated electrode 4E is provided thereon. The gate electrode 4 is formed under the following conditions: a flow rate of the $Si_2H_6$ gas being 5 sccm; a flow rate of the $GeH_4$ gas being 1 sccm; a film forming pressure being $1.3 \times 10^2$ Pa; a film forming temperature being 500° C.; and a film forming period being 38 minutes. Therefore, the gate electrode 4 is made of an $Si_{0.86}Ge_{0.16}$ film having the composition ratio of Ge being 0.16, and the composition ratio of Si being 0.84. The gate electrode 4 and the dummy electrode film 25 are patterned by the anisotropic etching such as the RIE process, using a mask prepared by the photolithograpy process. In this state, the gate electrode 4 is not doped by any of the n-type and p-type impurities.

The dummy electrode film 25 is as thick as the elevated electrode 4E in order that the gate side wall 7 can cover the side surface of the elevated electrode 4E. In this embodiment, the dummy electrode film 25 is an $Si_3N_4$ film prepared by the CVD process, sputtering, the like, and is 50 nm thick. Alternatively, the dummy electrode film 25 may be made of an $SiO_2$ film, and is required only to be made of a material selectively removable from the gate side wall 7.

After the formation of the gate electrode 4, an insulating film 4A for covering the gate electrode 4 is formed, and is constituted by a $SiO_2$ film prepared by the thermal oxidation process.

Figure 36:
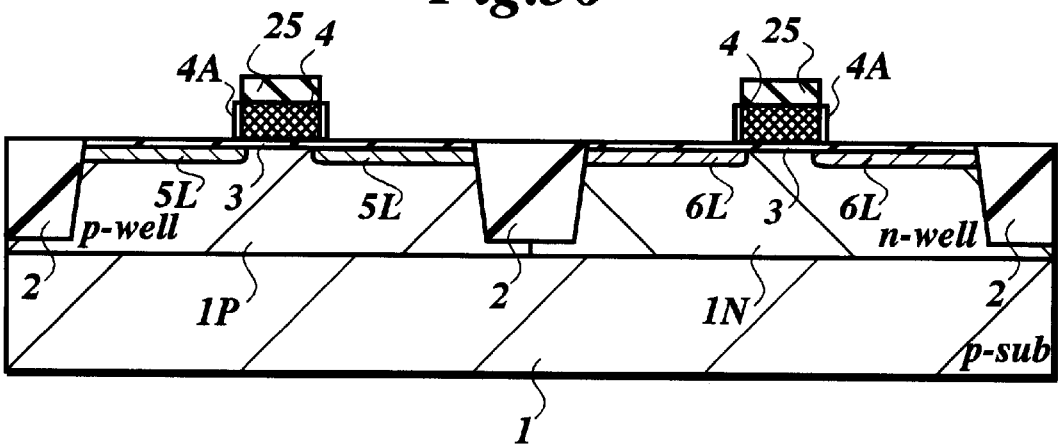

(5) Next, an extended source/drain process will be started. First of all, as shown in FIG. 36, an n-type semiconductor region 5L having a low impurity concentration is formed on the n-channel IGFET Qn forming area in order to make a pair of main electrodes 5 which are used as a source electrode and a drain electrode. Thereafter, a p-type semiconductor region 6L having a low impurity concentration is formed on the p-channel IGFET Qp forming area in order to make a pair of main electrodes 6 which are used as a source electrode and a drain electrode.

The semiconductor region 5L is formed by doping an n-type impurity into the main surface of the p-well region 1P, with the gate electrode 4, dummy electrode film 25, element isolation region 2, and a mask (shown in FIG. 11) covering the p-channel IGFET Qp all of which are used as an anit-impurity implantation mask. The n-type impurity is As which has a low diffusion speed and is suitable for shallowing. Generally, an amount of implantation energy for ion-implanting As is 10 keV to 50 keV, and dose is $10^{14}$ atoms/cm$^2$–$10^{15}$ atoms/cm$^2$. In this embodiment, the implantation energy of As is 15 keV, and dose thereof is $10^{14}$ atoms/cm$^2$. The semiconductor region 6L is formed by doping an n-type impurity into the main surface of the p-well region 1P, with the dummy electrode film 25, element isolation region 2, and a mask (shown in FIG. 12) used as an anti-impurity implantation mask. The mask covers the p-channel IGFET Qp. The p-type impurity is As which accomplishes a shallow ion implantation distribution and is suitable for shallowing. The p-type impurity is $BF_2$ which accomplishes a shallow ion implantation distribution and is suitable for shallowing. In this embodiment, ion implantation energy and dose of $BF_2$ are 10 keV and $10^{14}$ atoms/cm$^2$.

After ion-implanting As and $BF_2$, the semiconductor substrate 1 is preferably annealed in order to recover a damaged surface thereof and activate the impurity.

Figure 37:
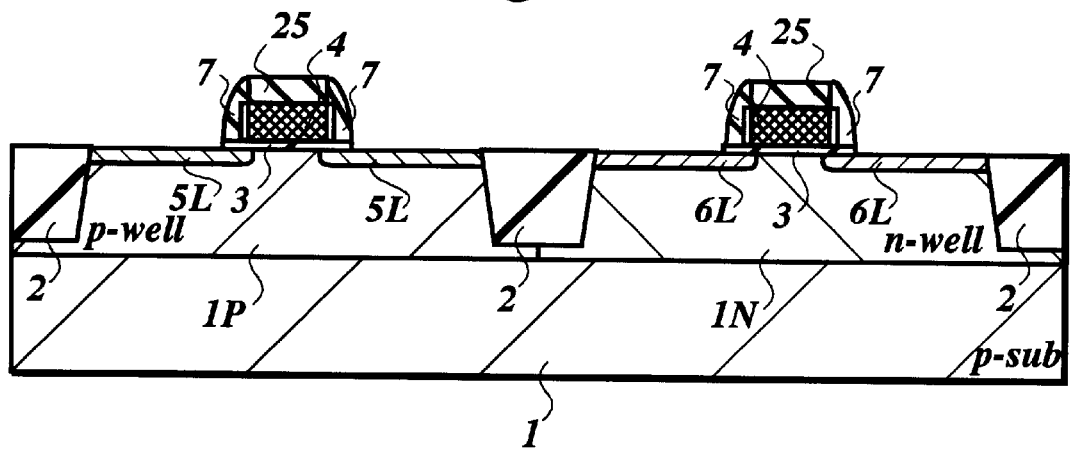

(6) As shown in FIG. 37, a gate side wall 7 is formed, via the insulating film 4A, on a side wall of the dummy electrode film 25 at areas for the n-channel IGFET Qn and p-channel IGFET Qp. In this embodiment, the gate side wall 7 is made of an $SiO_2$ film which has an etching selective ratio with respect to the dummy electrode film 25. The $SiO_2$ film is prepared by the CVD process, sputtering process or the like, and has its flat portion removed by the anisotropic etching such as the RIE.

Figure 38:
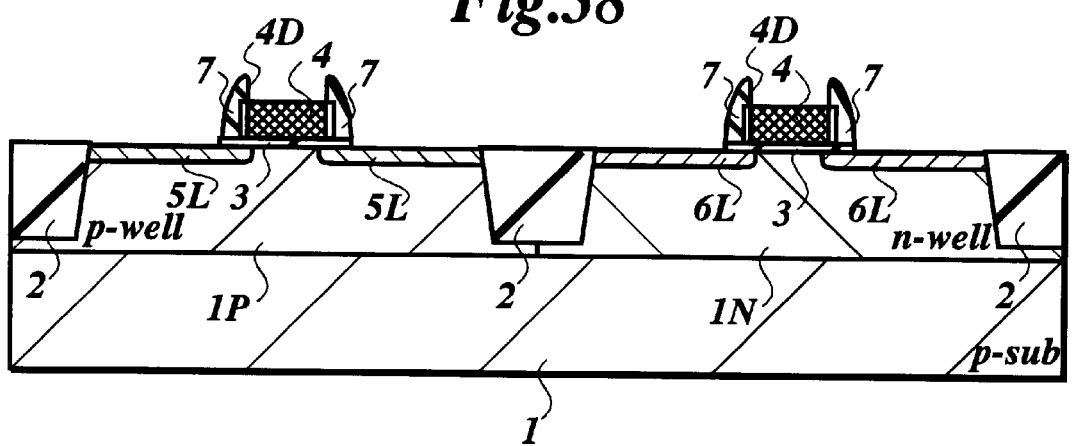

(7) As shown in FIG. 38, the dummy electrode film 25 on the gate electrode 4 is selectively removed. For this purpose, hot phosphoric acid is practically used. A cavity (dimple) 4D is formed on the gate electrode 4 and is surrounded by the gate side wall 7, thereby housing the elevated electrode 8G.

Figure 39:
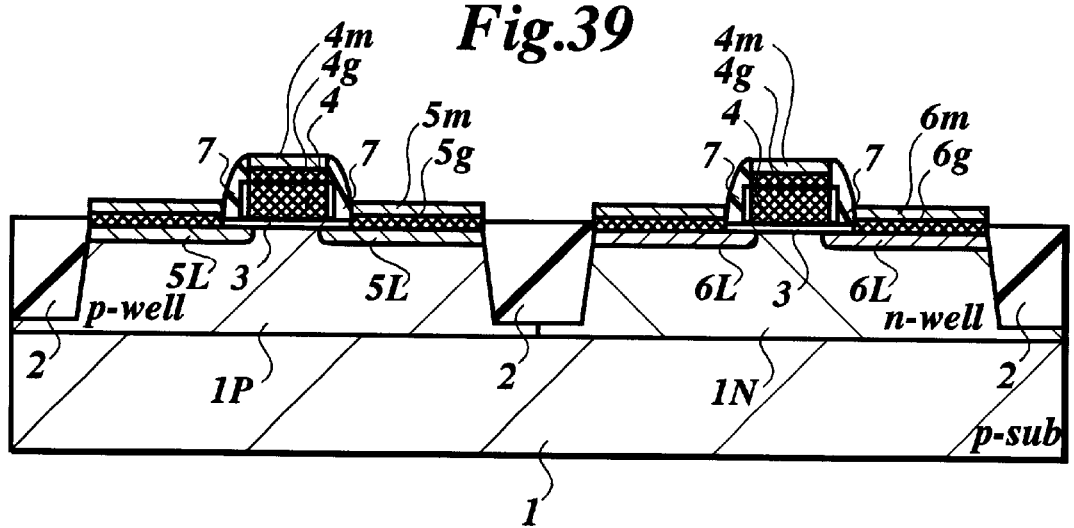

(8) Referring to FIG. 39, in order to form an elevated electrode, a first region 5g and a second region 5m are laid over one after another on the semiconductor region 5L at the n-channel IGFET Qn forming area, and a first region 4g and a second region 4m are laid over one after another on the gate electrode 4. Further, a first region 6g and a second region 6m are laid over one after another on the semiconductor region 6L at the p-channel IGFET Qp forming area, and a first region 4g and a second region 4m are laid over one after another on the gate electrode 4. The first regions 4g, 5 and 6g, and the second regions 4m, 5m and 6m are epitaxial growth layers prepared by the MBE process, according to this embodiment. A mixture of an $Si_2H_6$ gas and a $GeH_4$ gas is used as a source gas, thereby producing the first regions 4g, 5g and 6g which are composed of $Si_{0.86}Ge_{0.16}$ and are 10 nm thick. The second regions 4m, 5m and 6m are formed following the formation of the first regions 4g, 5g and 6g, and are made of 41.6 nm-thick Si films. These second regions are formed through epitaxial growth by setting the flow rate of the $GeH_4$ gas to 0 (zero) and using the $Si_2H_6$ gas as the source gas. As shown in FIG. 38, the first region 4g, and the second region 4m are positioned in the cavity 4D, and are surrounded by the gate side wall 7.

(9) In order to produce a pair of the main electrodes 5, as shown in FIG. 40, the n-type semiconductor region 5H having a high impurity concentration is formed at the n-channel IGFET Qn forming area. In order to make a pair of the main electrodes 6, the p-type semiconductor region 6H having a high impurity concentration is formed at the p-channel IGFET Qp forming area.

The n-type semiconductor region 5H is formed as follows. The n-type impurity is doped by ion implantation into the first region 5g and the second region 5m which constitute the elevated electrode 5E at the n-channel IGFET Qn forming area, so that the n-type impurity has a peak in the first and second regions 5g and 5m. Then, the doped n-type impurity is diffused onto the surface of the p-well region 1P. In this embodiment, since the complementary IGFET adopts the dual gate electrode structure, the n-type impurity is also doped in to the first region 4g and the second region 4m which constitute the elevated electrode 4E on the gate electrode 4. The doped n-type impurity is diffused onto the gate electrode 4, thereby producing the n-type gate electrode 4N. Further, the n-type impurity doped into the first and second regions 4g and 4m is activated, thereby obtaining the elevated electrode 4E. Still further, the n-type impurity doped into the first and second regions 5g and 5m is activated, thereby obtaining the elevated electrode 5E. As is used as the n-type impurity since it has a low diffusion speed and is suitable for shallowing. In this embodiment, implantation energy and dose of As are 50 keV and $3\times10^{15}$ atoms/cm$^2$, respectively.

The p-type semiconductor region 6H is formed as follows. The p-type impurity is doped by ion implantation into the first region 6g and the second region 6m which constitute the elevated electrode 6E at the p-channel IGFET Qp forming area, so that the p-type impurity has a peak in the first and second regions 6g and 6m. Then, the doped p-type impurity is diffused onto the surface of the n-well region 1N. In this embodiment, since the complementary IGFET adopts the dual gate electrode structure, the p-type impurity is also doped in to the first region 4g and the second region 4m which constitute the elevated electrode 4E on the gate electrode 4. The doped impurity is diffused onto the gate electrode 4, thereby producing the p-type gate electrode 4P. Further, the p-type impurity doped into the first and second regions 4g and 4m is activated, thereby obtaining the elevated electrode 4E. Still further, the p-type impurity doped into the first and second regions 6g and 6m is activated, thereby obtaining the elevated electrode 6E. $BF_2$ is used as the p-type impurity since it has a low diffusion speed and is suitable for shallowing. In this embodiment, implantation energy and dose of $BF_2$ is 40 keV and $3\times10^{15}$ atoms/cm$^2$, respectively.

The n-type and p-type impurities are diffused and activated in $N_2$ gas, at 1000° C. and for 10 seconds by the annealing process such as the RTA process.

When the process shown in FIG. 40 is finished, the main electrodes 5 constituted by the semiconductor regions 5L and 5H are formed, thereby substantially completing the n-channel IGFET Qn. In the channel forming region of the n-channel IGFET Qn, the acceptor concentration is approximately $10^{17}$ atoms/cm$^2$ – $10^{18}$ atoms/cm$^3$, the donor concentration of the main electrodes 5 is approximately $10^{19}$ atoms/cm$^3$–$10^{21}$ atoms/cm$^3$, and a junction depth of the main electrodes 5 is approximately 50 nm–200 nm. Having the dual gate structure, the gate electrode 4N of the n-channel IGFET Qn is set to the n-type, is of a surface channel type, and is suitable for suppressing short channel effects, promoting the high speed operation and minimization. The main electrodes 6 including the semiconductor regions 6L and 6H are also formed, thereby substantially completing the p-channel IGFET Qp. In the channel forming region of the p-channel IGFET Qp, the donor concentration is approximately $10^{17}$ atoms/cm$^3$–$10^{18}$ atoms/cm$^3$, the acceptor concentration of the main electrodes 6 is approximately $10^{19}$ atoms/cm$^3$–$10^{21}$ atoms/cm$^3$, and a junction depth of the main electrodes 6 is approximately 50 nm–200 nm. Having the dual gate structure, the gate electrode 4P of the P-channel IGFET Qp is set to the p-type, is of a surface channel type, and is suitable for suppressing short channel effects, promoting the high speed operation and minimization.

When ion-implanting the n-type and p-type impurities, SiO$_2$ films are preferably used as buffer films for protecting the surfaces of the elevated electrodes 4E, 5E and 6E against damages and contamination.

(10) As shown in FIG. 41, in the n-channel IGFET Qn, the silicide electrode 8G and 8M are formed on the elevated electrodes 4E and 5E, respectively. Further, in the p-channel IGFET Qp, the silicide electrodes 8G and 8M are formed on the elevated electrodes 4E and 6E, respectively. These silicide electrodes 8G and 8M are made of CoSi$_y$ films prepared through salicidation in the same manufacturing process. The CoSi$_y$ films are formed as follows. First of all, the surfaces of the elevated electrodes 4E, 5E and 6E are exposed. Thereafter, a Co film is prepared all over the semiconductor substrate 1 including the exposed surfaces, and a TiN film is formed thereon as a cap layer. Both the Co and TiN films are formed by sputtering. The Co film is 12 nm thick, for example. The Co film undergoes two annealing steps, i.e. it is first annealed in non-oxide atmosphere at 500° C. for 60 seconds in order to remove a non-reactive Co film, and is then annealed at 750° C. for 30 seconds. Thus, the silicide electrodes 8G and 8M having the thickness of 40 nm will be prepared. The annealing steps are executed by the RTA process, in which a mixture of sulfuric acid and hydrogen peroxide is actually used to remove the non-reactive Co film.

In the n-channel IGFET Qn, the silicide electrode 8G is prepared through silicidation of a part of the second region 4n of the elevated electrode 4E which is composed of Si and is free from Ge. Therefore, the silicide electrode 8G is free from Ge. Since the side surface of the first region 4g of the elevated electrode 4E is covered by the gate side wall 7 during silicidation, the silicide electrode 8G does not contain any Ge. In addition, the silicide electrode 8M is formed through silicidation of at least a part of the second region 5n, and is free from Ge. Still further, in the p-channel IGFET Qp, the silicide electrode 8G is prepared through silicidation of at least a part of the second region 4n of the elevated electrode 4E which is composed of Si and is free from Ge. In the n-channel IGFET Qn, the silicide electrode 8G is prepared through silicidation of a part of the second region 4n of the elevated electrode 4E which is composed of Si only and is free from Ge. The silicide electrode 8G is free from Ge. Beside, since the side surface of the first region 4g of the elevated electrode 4E is covered by the gate side wall 7 during silicidation, the silicide electrode 8G does not contain any Ge. In addition, the silicide electrode 8M is formed through silicidation of at least a part of the second region 6p of the silicide electrode 6E composed of only Si without any Ge, and is free from Ge.

FIG. 41 (also FIG. 33) shows that the second regions 4n, 4p, 5n and 6p are partially remain non-silicided in the elevated electrodes 4E, 5E and 6E, as described with respect to the manufacturing process in the first embodiment. However, in order to reduce connection resistances between the elevated electrode 6E and the silicide electrode 8M, and between the elevated electrode 6E and the silicide electrode 8M, all of the second regions 4n, 4p, 5n and 6p preferably undergo silicidation.

(11) An insulated inter-layer film 10, connection hole 11, contact plug electrode 12, insulated inter-layer film 13, connection hole 14 and wiring 15 will be sequentially formed, so that the semiconductor integrated circuit of this embodiment will be completed.

The semiconductor integrated circuit having the structure of the fifth embodiment is as effective as the semiconductor integrated circuit of the fourth embodiment. Further the silicidie electrode 8G is formed through silicidation of the SiGe first region 4g of the elevated electrode 4E which is covered by the gate side wall 7, so that the silicide electrode 8G is further substantially free from Ge, and can have low resistivity.

Although the invention has been described based on the specific embodiments, it will be appreciated that the invention is not limited to the foregoing embodiments. For example, the invention is applicable to a semiconductor integrated circuit having a bi-polar transistor with an elevated emitter electrode which is formed of an epitaxial growth layer placed on a semiconductor region of the emitter electrode (main electrode). The invention is also applicable to a semiconductor integrated circuit having a diode element with an elevated anode or a cathode electrode composed of an eptaxial growth layer formed on a semiconductor region. The invention is also applicable to a semiconductor integrated circuit having a wiring formed Cu(copper) film. The wiring is connected to the gate electrode or the main electrode of an IGFET via a silicide electrode and a contact plug electrode.

As described so far, the invention can provide the semiconductor integrated circuit which is advantageous in the following respects. First of all, the impurities doped into the gate electrode are prevented from leaking to the channel regions, so that the semiconductor integrated circuit including the IFGET can have a stable threshold voltage, and improve electrical reliability.

Secondly, the concentration of the impurities doped into the gate electrode can have sufficient concentration throughout the gate electrode, and prevent the gate electrode from changing into a depletion layer. Therefore, the semiconductor integrated circuit including the IFGET can have a stable threshold voltage, and improve electrical reliability.

Thirdly, the invention provides the semiconductor integrated circuit which has the first and second advantages. Both of the complementary IGFET and the channel conductive type IGFET can have stable threshold voltages, which improves the electrical reliability of the semiconductor integrated circuit.

Fourthly, the invention provides the semiconductor integrated circuit having any of the first to third advantages. Further, the invention can provide the semiconductor integrated circuit in which the IGFET is minimized and circuit integration is further promoted.

Fifthly, the invention can provide the semiconductor integrated circuit which have any of the first to third advantages. Further, the semiconductor integrated circuit is provided with the IGFET whose switching speed is accelerated and power supply voltage is reduced. Such a semiconductor integrated circuit can assure an accelerated circuit operation and reduced power consumption. Especially, the silicide electrode provided at the gate electrode of the IGFET can have low resistivity, which is effective in accelerating the switching operation and reducing the power supply voltage of the IGFET. Therefore, the semiconductor integrated circuit assures an accelerated circuit operation and reduced power consumption.

Sixthly, the invention provides the method of manufacturing the semiconductor integrated circuit which has any of the foregoing first to fifth advantages can reduce the number of manufacturing steps. Especially, this method can reduce the number of steps for manufacturing the complementary IGFET.

Seventhly, the invention provides the semiconductor integrated circuit in which the source and drain electrodes (main electrodes) are made shallow in the IGFET having elevated electrodes, and the IGFET is minimized, and circuit integration is further promoted.

Eighthly, the invention provides the semiconductor integrated circuit which has the seventh advantage, and low resistivity and reduced power supply voltage. The semiconductor integrated circuit can accelerate its circuit operation and reduce power consumption.

As a ninth advantage, the invention provides the semiconductor integrated circuit which has the seventh and eighth advantages, and a reduced contact resistance between the elevated electrode and the silicide electrode, and can accelerate the circuit operation and reduce power consumption.

Tenthly, the invention provides the method for manufacturing the semiconductor integrated circuit which has the seventh to ninth advantages, and is carried with the reduced number of steps.

As a final advantage, the invention provides the semiconductor integrated circuit which have at least two of the first and tenth features, or the method of producing the same.

What is claimed is:

1. A semiconductor device comprising:
   an insulated gate field effect transistor having a pair of main electrodes used as source and drain electrodes, a channel forming region provided between the pair of main electrodes, an insulating gate film formed on the channel forming region, and a gate electrode formed on the insulating gate film, and provided with a first region including a first group IV element and a second group IV element and formed in contact with the insulating gate film, and a second region including the first group IV element and formed on the insulating gate film over and in contact with the first region, the first and second regions having an identical conductivity type;
   an elevated electrode formed on the main electrodes, and having a third region including a third group IV element and a fourth group IV element and a fourth region formed on the main electrode over and in contact with the third region and including the third group IV element;
   a first silicide electrode formed in contact with the second region of the gate electrode, and being substantially free from the second group IV element; and
   a second silicide electrode formed in contact with the fourth region of the elevated electrode, and being substantially free from the fourth group IV element.

2. The semiconductor device of claim 1, wherein the first region of the gate electrode has a composition ratio of the second group IV element gradually reduced in accordance with a distance from the insulating gate film.

3. The semiconductor device of claim 1, wherein the first region of the gate electrode has a composition ratio of the second group IV element stepwise reduced in accordance with a distance from the insulating gate film.

4. The semiconductor device of claim 1, wherein the first group IV element of the gate electrode is Si (silicon), the second group IV element of the gate electrode is (Ge (germanium), and the first silicide electrode is composed of $CoSi_y$ or $TiSi_y$ layer which is substantially free from Ge.

5. The semiconductor device of claim 4, wherein the first region of the gate electrode has a thickness larger than a width of a depletion layer of the gate electrode that includes Si.

6. The semiconductor device of claim 5, wherein a composition ratio of Ge of the first region of the gate electrode is at least 0.1 or larger.

7. The semiconductor device of claim 6, wherein the gate electrode contains at least B (boron).

8. The semiconductor device of claim 6, wherein the gate electrode contains at least As (arsenic).

9. The semiconductor device of claim 1, wherein the first group IV element of the gate electrode is Si, the second group IV element of the gate electrode is C (carbon), and the first silicide electrode is composed of a $CoSi_y$ or $TiSi_y$ layer which is substantially free of C.

10. The semiconductor device of claim 1, wherein the elevated electrode is an epitaxial growth layer.

11. The semiconductor device of claim 10, wherein the third group IV element of the elevated electrode is Si, the fourth group IV element of the elevated electrode is Ge, and the second silicide electrode is made of a $CoSi_y$ or $TiSi_y$ layer which is substantially free from Ge.

12. The semiconductor device of claim 11, wherein a composition ratio of Ge in the third region of the elevated electrode is at least 0.1 or more, and a thickness of the third region is at least 2 nm from the the main electode.

13. The semiconductor device of claim 12, wherein the elevated electrode contains at least B.

14. The semiconductor device of claim 12, wherein the elevated electrode contains at least As.

15. The semiconductor device of claim 10, wherein the third group IV element of the elevated electrode is Si, fourth group IV element of the elevated electrode is C, and the second silicide electrode made of a $CoSi_y$ or $TiSi_y$ layer which is substantially free from C.

16. The semiconductor device of claim 1, wherein a layer is added between the insulating gate film and the first region of the gate electrode, the larger is thinner than the first region, and is composed of the first group IV element or the second group IV element.

17. The semiconductor device of claim 16, wherein a thickness of the layer is approximately 1 nm or less.

18. A semiconductor device comprising:
   a first conductivity type insulated gate field effect transistor having a pair of first conductivity type main electrodes used as source and drain electrodes, a second conductivity type channel forming region provided between the pair of first conductivity type main electrodes, a first insulating gate film formed on the second conductivity type channel forming region, and a first gate electrode formed on the first insulating gate film, and provided with a first region including a first group IV element and a second group IV element and formed in contact with the first insulating gate film, and a second region including the first group IV element and formed on the first insulating gate film over and in contact with the first region, the first and second regions having an identical conductivity type; and
   a second conductivity type insulated gate field effect transistor having a pair of second conductivity type main electrodes used as source and drain electrodes, a first conductivity type channel forming region provided between the pair of second conductivity type main electrodes, a second insulating gate film formed on the first conductivity type channel forming region, and a second gate electrode formed on the second insulating gate film, and provided with a third region including the first group IV element and the second group IV element and formed in contact with the second insulating gate film, and a fourth region including the first group IV element and formed on the second insulating gate film over and in contact with the third region, the third and fourth regions having the identical conductivity type.

19. The semiconductor device of claim 18, wherein the first region of the first gate electrode and the third region of the second gate electrode has a composition ratio of the second group IV element gradually reduced in accordance with a distance from the insulating gate film.

20. The semiconductor device of claim 18, wherein the first region of the first gate electrode and the third region of the second gate electrode has a composition ratio of the second group IV element stepwise reduced in accordance with a distance from the insulating gate film.

21. The semiconductor device of claim 18, wherein the first group IV element of the first and second gate electrodes is Si, and the second group IV element of the first and second gate electrodes is Ge.

22. The semiconductor device of claim 18, wherein the first group IV element of the first and second gate electrodes is Si, and the second group IV element of the first and second gate electrodes is C.

23. The semiconductor device of claim 18 further comprising:
   a first silicide electrode formed in contact with the second region of the first gate electrode, and being substantially free from the second group IV element; and
   a second silicide electrode formed in contact with the fourth region of the second gate electrode, and being substantially free from the second group IV element.

24. The semiconductor device of claim 23, wherein the first group IV element of the first and second gate electrodes is Si, the second group IV element of the first and second gate electrodes is Ge, and the first and second silicide electrodes are composed of $CoSi_y$ or $TiSi_y$ layer which is substantially free from Ge.

25. The semiconductor device of claim 23, wherein the first group IV element of the first and second gate electrodes is Si, the second group IV element of the first and second gate electrodes is Ge, and the first and second silicide electrodes are composed of $CoSi_y$ or $TiSi_y$ layer which is substantially free from C.

26. The semiconductor device of claim 18 further comprising:
   first elevated electrodes formed on the first conductivity type main electrodes, and having a fifth region including the first group IV element and the second group IV element and a sixth region formed on the first conductivity type main electrodes via the fifth region and including the second group IV element; and
   second elevated electrodes formed on the second conductivity type main electrodes, and having a seventh region including the first group IV element and the second group IV element and a eighth region formed on the second conductivity type main electrodes via the seventh region and including the second group IV element.

27. The semiconductor device of claim 26 further comprising:
   a first silicide electrode formed in contact with the second region of the first gate electrode, and being substantially free from the second group IV element; and
   a second silicide electrode formed in contact with the fourth region of the second gate electrode, and being substantially free from the second group IV element.

28. The semiconductor device of claim 27 further comprising:
   third silicide electrodes formed in contact with the sixth region of the first elevated electrodes, and being substantially free from the second group IV element; and
   fourth silicide electrode formed in contact with the eighth region of the second elevated electrodes, and being substantially free from the second group IV element.

* * * * *